United States Patent [19]
Nishi et al.

[11] Patent Number: 6,048,661
[45] Date of Patent: Apr. 11, 2000

[54] POLYMERIC COMPOUNDS, CHEMICALLY AMPLIFIED POSITIVE TYPE RESIST MATERIALS AND PROCESS FOR PATTERN FORMATION

[75] Inventors: Tsunehiro Nishi; Jun Hatakeyama; Shigehiro Nagura; Toshinobu Ishihara, all of Niigata-ken, Japan

[73] Assignee: Shin-Etsu Chemical Co., Ltd., Tokyo, Japan

[21] Appl. No.: 09/033,147

[22] Filed: Mar. 2, 1998

[30] Foreign Application Priority Data

Mar. 5, 1997 [JP] Japan ................................. 9-050639

[51] Int. Cl.$^7$ ..................................... G03F 7/004
[52] U.S. Cl. ....................... 430/270.1; 430/905; 430/909; 430/910; 526/313; 526/321
[58] Field of Search ................. 430/270.1, 905, 430/909, 910; 526/313, 321

[56] References Cited

U.S. PATENT DOCUMENTS

| | | | |
|---|---|---|---|
| 5,558,978 | 9/1996 | Schadeli et al. | 430/270.1 |
| 5,587,274 | 12/1996 | Kishida et al. | 430/270.1 |
| 5,670,299 | 9/1997 | Urano et al. | 430/326 |
| 5,780,206 | 7/1998 | Urano et al. | 430/325 |
| 5,824,451 | 10/1998 | Aoai et al. | 430/270.1 |
| 5,827,634 | 10/1998 | Thackeray et al. | 430/270.1 |
| 5,876,900 | 3/1999 | Watanabe et al. | 430/288.1 |
| 5,882,835 | 3/1999 | Park et al. | 430/170 |

*Primary Examiner*—John S. Chu
*Attorney, Agent, or Firm*—McAulay Nissen Goldberg Kiel & Hand, LLP

[57] ABSTRACT

Provided are polymeric compounds which, when used as base resins in resist materials, can yield chemical resist materials having high sensitivity, high resolution, a high exposure latitude, and good process adaptability, exhibiting excellent resistance to plasma etching, and giving resist patterns having high thermal resistance, as well as chemically amplified positive type resist materials using such polymeric compounds as base resins. These chemically amplified positive type resist materials use a base resin comprising a polymeric compound having a weight-average molecular weight of 1,000 to 500,000 and having one or more hydroxyl and/or carboxyl groups in the molecule, part or all of the hydrogen atoms of the hydroxyl and/or carboxyl groups being replaced by groups of the following general formula (1)

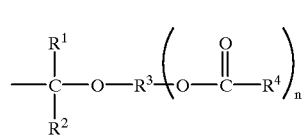

and additionally contain an acid generator, a dissolution inhibitor, a basic compound, and an aromatic compound having a group of the formula ≡C—COOH.

19 Claims, No Drawings

POLYMERIC COMPOUNDS, CHEMICALLY AMPLIFIED POSITIVE TYPE RESIST MATERIALS AND PROCESS FOR PATTERN FORMATION

BACKGROUND OF THE INVENTION

1. Field of the Invention

This invention relates to polymeric compounds having one or more hydroxyl and/or carboxyl groups in the molecule wherein part or all of the hydrogen atoms of the hydroxyl and/or carboxyl groups are replaced by groups of the general formula (1) that will be given later and which, when used as base resins in resist materials, can yield chemically amplified positive type resist materials exhibiting very high alkali dissolution contrast before and after exposure to light, having high sensitivity and high resolution, and hence especially suitable for use as fine pattern-forming materials in the fabrication of very large scale integrated circuits, and to chemically amplified positive type resist materials containing such polymeric compounds, and to a process for pattern formation.

2. Description of the Related Art

In recent years, a finer pattern design rule has come to be desired with an increase in the integration density and operating speed of large scale integrated circuits. Under these circumstances, deep ultraviolet lithography is regarded as a promising fine patterning technique of the next generation. Deep ultraviolet lithography permits patterning even to a size of 0.5 μm or less and, when a resist material having low light absorptivity is used, enables the formation of patterns having sidewalls almost perpendicular to the substrate.

Recently developed chemically amplified positive type resist materials using acid catalysts (as described in Japanese Patent Publication (JP-B) No.2-27660/'90, Japanese Patent Provisional Publication (JP-A) No. 63-27829/'88) are expected to be especially promising resist materials for deep ultraviolet lithography which utilizes a KrF excimer laser having high luminance as a light source of far ultraviolet radiation and is characterized by high sensitivity, high resolution and good resistance to dry etching.

As such chemically amplified positive type resist materials, two-component systems comprising a base resin and an photo-acid generator and three-component systems comprising a base resin, an acid generator and a dissolution inhibitor having acid-labile groups are known.

For example, a resist material comprising poly-p-tert-butoxystyrene and an acid generator is proposed in Japanese Patent Provisional Publication No. 62-115440/'87. Moreover, as resist materials analogous thereto, a two-component resist material comprising a resin having tert-butoxy groups in the molecule and an acid generator is proposed in Japanese Patent Provisional Publication No. 3-223858/'91, and a two-component resist material comprising polyhydroxystyrene containing methyl, isopropyl, tert-butyl, tetrahydropyranyl and trimethylsilyl groups and an acid generator is proposed in Japanese Patent Provisional Publication No. 4-211258/'92.

Furthermore, a resist material comprising a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and an acid generator is proposed in Japanese Patent Provisional Publication No. 6-100488/'94.

However, the base resins used in these resist materials have acid-labile groups in side chains. Thus, if the acid-labile groups are ones capable of being decomposed by a strong acid (i.e., tert-butyl and tert-butoxycarbonyl groups), they may be deactivated as a result of reaction with basic compounds present in the air. Consequently, the acid-labile groups become difficult to decompose, so that the patterns of the resist material tend to form a T-top profile. On the other hand, alkoxyalkyl groups such as ethoxyethyl are decomposed by a weak acid and, therefore, are not significantly affected by basic compounds present in the air. However, when polymers having bulky groups or a high degree of substitution are used in order to achieve a high dissolution-retarding effect on alkali, they involve problems such as low thermal resistance and insufficient sensitivity and resolution. Thus, these resist materials are still less than satisfactory for practical purposes. Accordingly, it would be desirable to solve these problems.

SUMMARY OF THE INVENTION

The present invention has been made in view of the above-described circumstances, and an object thereof is to provide polymeric compounds which, when used as base resins in resist materials, can yield chemical resist materials having higher sensitivity, higher resolution, a higher exposure latitude, and better process adaptability than conventional resist materials, exhibiting excellent resistance to plasma etching, and giving resist patterns having high thermal resistance, as well as chemically amplified positive type resist materials using such polymeric compounds as base resins, and a process for pattern formation.

The present inventor made intensive investigations for the purpose of achieving the above object and has now found that novel polymeric compounds having a weight-average molecular weight of 1,000 to 500,000 and having one or more hydroxyl and/or carboxyl groups in the molecule in which part or all of the hydrogen atoms of the hydroxyl and/or carboxyl groups are replaced by groups of the following general formula (1), which may be prepared in the manner as will be described later, are useful as base resins in resist materials, that chemically amplified positive type resist materials using such a polymeric compound as a base resin and additionally containing an acid generator and the like (among others, chemically amplified positive type resist materials further containing a dissolution inhibitor and chemically amplified positive type resist materials further containing a basic compound) enhance the dissolution contrast of the resist film and, in particular, increase the dissolution rate after exposure to light, and that chemically amplified positive type resist materials further containing an aromatic compound having a group of the formula ≡C—COOH in the molecule improve the PED stability of the resist and the edge roughness on a nitride film substrate, exhibit high resolution, a high exposure latitude, and good process adaptability, are advantageous for practical purposes of fine patterning, and are highly effective as resist materials for the fabrication of very large scale integrated circuits.

Accordingly, the present invention provides:

[I] A polymeric compound having a weight-average molecular weight of 1,000 to 500,000 and having one or more hydroxyl and/or carboxyl groups in the molecule, part or all of the hydrogen atoms of the hydroxyl groups and/or the hydrogen atoms of the carboxyl groups being replaced by groups of the following general formula (1):

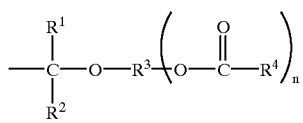
(1)

wherein $R^1$ and $R^2$ are each a hydrogen atom or a straight-chain, branched or cyclic alkyl group of 1 to 6 carbon atoms; $R^3$ is a (n+1)-valent hydrocarbon group of 1 to 18 carbon atoms which may have one or more heteroatoms; $R^1$ and $R^2$, $R^1$ and $R^3$, $R^2$ and $R^3$, or $R^1$, $R^2$ and $R^3$ may form a ring, and in cases of ring formation, $R^1$ and $R^2$ are each a divalent or trivalent hydrocarbon group of 1 to 6 carbon atoms, and $R^3$ is a (n+2)- or (n+3)-valent hydrocarbon group of 1 to 18 carbon atoms which may have one or more heteroatoms; $R^4$ is a monovalent hydrocarbon or alkoxy group of 1 to 18 carbon atoms which may have one or more heteroatoms; and n is an integer of 1 to 6.

[II] A polymeric compound having a weight-average molecular weight of 1,000 to 500,000 and having repeating units of the following general formula (2):

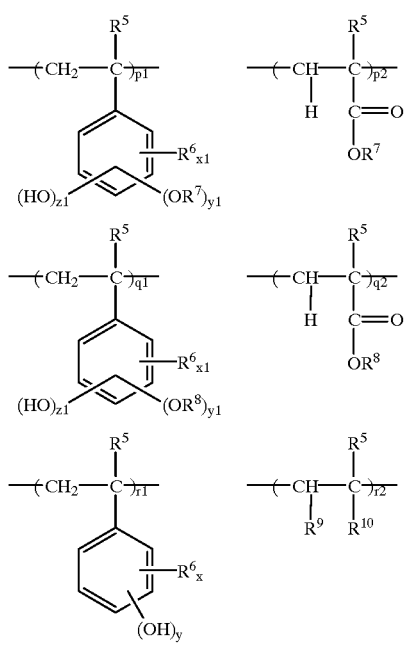
(2)

wherein $R^5$ is a hydrogen atom or a methyl group; $R^6$ is a straight-chain, branched or cyclic alkyl group of 1 to 8 carbon atoms; $R^7$ is a group represented the above general formula (1); $R^8$ is an acid-labile group; $R^9$ is a hydrogen atom or a cyano group; $R^{10}$ is a hydrogen atom, a cyano group, or COOY in which Y is a hydrogen atom or a straight-chain, branched or cyclic alkyl group of 1 to 6 carbon atoms; $R^9$ and $R^{10}$ may be combined with each other to form —CO—O—CO—; x is 0 or a positive integer and y is a positive integer, and they satisfy the condition represented by $x+y \leq 5$; $x_1$ and $z_1$ are each 0 or a positive integer and $y_1$ is a positive integer, and they satisfy the condition represented by $x_1+y_1+z_1 \leq 5$; and $p_1$, $p_2$, $q_1$, $q_2$, $r_1$ and $r_2$ are molar proportions and satisfy the condition represented by $p_1+p_2+q_1+q_2+r_1+r_2=1$, provided that each of them is 0 or a positive number, but $p_1$ and $p_2$ cannot be 0 at the same time and $r_1$ and $r_2$ cannot be 0 at the same time, and they satisfy the conditions represented by $0 \leq p_1 \leq 0.8$, $0 \leq p_2 \leq 0.8$, $0 \leq q_1 \leq 0.4$, $0 \leq q_2 \leq 0.4$ and $0 < p_1+p_2+q_1+q_2 \leq 0.8$.

[III] A polymeric compound having a weight-average molecular weight of 1,000 to 500,000 and having repeating units of the following general formula (3):

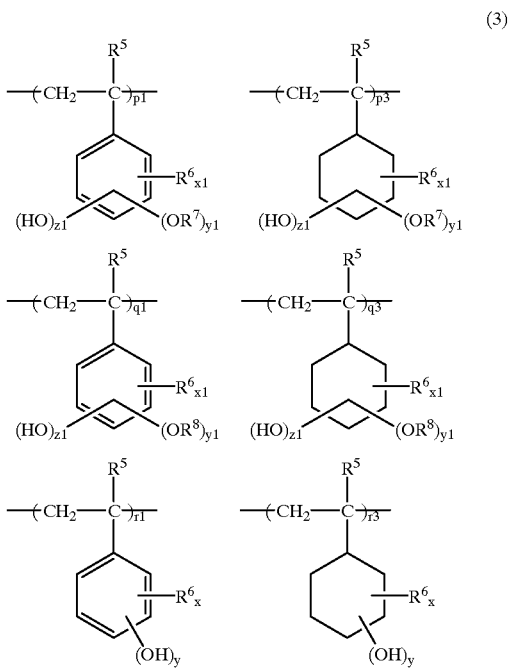
(3)

wherein $R^5$, $R^6$, $R^7$, $R^8$, x, y, $x_1$, $y_1$, and $z_1$ have the same meanings as described above; and $p_1$, $p_3$, $q_1$, $q_3$, $r_1$ and $r_3$ are molar proportions and satisfy the condition represented by $q_1+p_3+q_1+q_3+r_1+r_3=1$, provided that $p_1$ and $r_1$ are each a positive number, $p_3$, $q_1$, $q_3$ and $r_3$ are each 0 or a positive number, but $p_3$, $q_3$ and $r_3$ cannot be 0 at the same time, and they satisfy the conditions represented by $0<p_1 \leq 0.8$, $0 \leq p_3 \leq 0.8$, $0 \leq q_1 \leq 0.4$, $0 \leq q_3 \leq 0.4$ and $0 < p_1+p_3+q_1+q_3 \leq 0.8$.

[IV] A polymeric compound having a weight-average molecular weight of 1,000 to 500,000 and having repeating units of the following general formula (4):

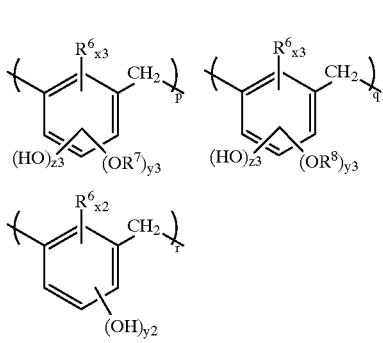
(4)

wherein $R^6$, $R^7$ and $R^8$ have the same meanings as described above; $x_2$ is 0 or a positive integer and $y_2$ is a positive integer, and they satisfy the condition represented by $x_2+y_2 \leq 4$; $x_3$ and $z_3$ are each 0 or a positive integer and $y_3$ is a positive integer, and they satisfy the condition represented by $x_3+y_3+z_3 \leq 4$; and p, q and r are molar proportions and satisfy the condition represented by $p+q+r=1$, provided that p and r are each a positive number, q is 0 or a positive number, and they satisfy the conditions represented by $0<p\leq 0.8$, $0\leq q\leq 0.4$ and $0<p+q\leq 0.8$.

Furthermore, hydrogen atoms of phenolic hydroxide groups and/or hydrogen atoms of carboxyl groups of the repeating units of the above general formulae (1) to (4) may be replaced in a range of more than 0 to 50 mole % for the formation of intramolecular and/or intermolecular crosslikage by a group having a C—O—C group shown as the following general formula (CR1) and/or (OR2):

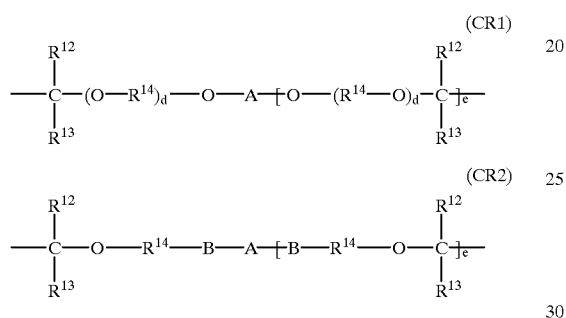

wherein $R^{12}$ and $R^{13}$ are each a hydrogen atom or a straight-chain, branched or cyclic alkyl group of 1 to 8 carbon atoms; $R^{12}$ and $R^{13}$ may form a ring, and in cases of ring formation, $R^{12}$ and $R^{13}$ are each a straight-chain or branched alkylene group of 1 to 8 carbon atoms; $R^{14}$ is a straight-chain or branched alkylene group of 1 to 10 carbon atoms; c is a positive integer of 1 to 7 and d is 0 or a positive integer of 1 to 10; A is a (c+1)-valent aliphatic or alicyclic saturated hydrocarbon group of 1 to 50 carbon atoms, aromatic hydrocarbon group or heterocyclic group, wherein each group may have one or more heteroatoms, or part of hydrogen atoms bonding to carbon atoms of the group may be replaced by hydroxide groups, carboxyl groups, acyl groups or fluoride atoms; B is —CO—O—, —NHCO—O—, or —NHCONH—.

The present invention also provides a chemically amplified positive type resist material.

[V] A chemically amplified positive type resist material containing an organic solvent (A), a base resin comprising a polymeric compound as described in [I], [II], [III] or [IV], and an acid generator (C).

[VI] A chemically amplified positive type resist material as described above which further contains, in addition to base resin (B), another base resin (D) comprising a polymeric compound having a weight-average molecular weight of 3,000 to 300,000 and having repeating units of the following general formulae (5) and/or (6) and/or (7), the hydrogen atoms of the hydroxyl groups present therein and/or the hydrogen atoms of the carboxyl groups present therein being partially replaced by acid-labile groups to an overall average degree of substitution of 0 to 80 mole %.

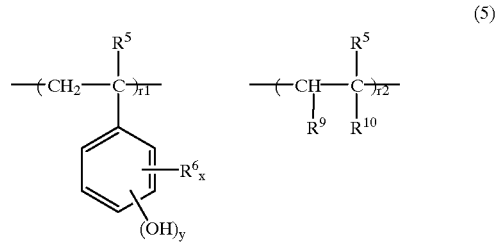

wherein $R^5$ is a hydrogen atom or a methyl group; $R^6$ is a straight-chain, branched or cyclic alkyl group of 1 to 8 carbon atoms; $R^9$ is a hydrogen atom or a cyano group; $R^{10}$ is a hydrogen atom, a cyano group, or COOY in which Y is a hydrogen atom or a straight-chain, branched or cyclic alkyl group of 1 to 6 carbon atoms; $R^9$ and $R^{10}$ may be combined with each other to form —CO—O—CO—; x is 0 or a positive integer and y is a positive integer, and they satisfy the condition represented by $x+y\leq 5$; and $r_1$ and $r_2$ are molar proportions and satisfy the condition represented by $r_1+r_2=1$, provided that $r_1$ and $r_2$ are each 0 or a positive number, but $r_1$ and $r_2$ cannot be 0 at the same time.

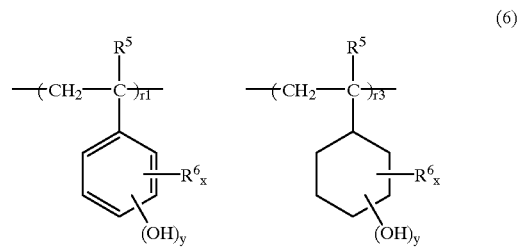

wherein $R^5$ $R^6$, x and y have the same meanings as described above; and $r_1$ and $r_3$ are molar proportions and satisfy the condition represented by $r_1+r_3=1$, provided that $r_1$ and $r_3$ are each a positive number.

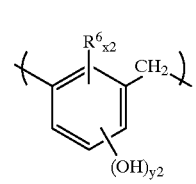

wherein $R^6$ has the same meaning as described above; and $x_2$ is 0 or a positive integer and $y_2$ is a positive integer, and they satisfy the condition represented by $x_2+y_2\leq 4$.

[VII] A chemically amplified positive type resist material as described above which further contains a dissolution inhibitor (E).

[VIII] A chemically amplified positive type resist material as described above which further contains a basic compound (F) as an additive.

[IX] A chemically amplified positive type resist material as described above which further contains an aromatic compound (G) having a group of the formula ≡C—COOH in the molecule as an additive.

[X] A chemically amplified positive type resist material as described above which further contains an ultraviolet absorber (H).

[XI] A chemically amplified positive type resist material as described above which further contains an acetylene alcohol derivative (I).

The present invention further provides the following process for pattern formation.

[XII] A process for pattern formation comprising the steps: (i) coating the above chemically amplified positive resist material on a substrate, (ii) following a subsequent heat treatment, an exposure step by high-energy radiation of 300 nm or less or electron beam through a photomask, (iii) following an optional heat treatment, a development step using a developing solution.

When the above-described polymeric compounds are used as base resins in resist materials, they have the advantage of exhibiting high dissolution-retarding power and high dissolution contrast after exposure to light, especially because part or all of the hydrogen atoms of the hydroxyl groups and/or carboxyl groups present therein are replaced by groups of the above general formula (1).

Specifically, in the case of polymers having alkoxyalkyl groups added alone to side chains, their elimination reaction proceeds in the presence of a weak acid, so that a T-top profile is seldom formed. However, since their dissolution-retarding effect on alkali is low, a polymer having a high degree of substitution must be used in order to achieve high dissolution contrast. Consequently, this polymer has the disadvantage of lacking thermal resistance. On the other hand, when polymers in which the hydrogen atoms of the phenolic hydroxyl groups present in side chains are replaced by tert-butoxycarbonyl groups are used in resist materials, these resist materials have the advantage of exhibiting high alkali dissolution-retarding power, high dissolution contrast at a low degree of substitution, and high thermal resistance. However, in order to eliminate these groups and thereby render the resist film soluble in alkali, it is necessary to use an acid generator which produces a strong acid such as trifluoromethanesulfonic acid. As described above, the use of such an acid is disadvantageous in that a T-top profile tends to be formed.

In contrast to these polymeric compounds, resist materials using the above-described polymeric compounds in which part or all of the hydrogen atoms of the hydroxyl and/or carboxyl groups present therein are replaced by groups of the above general formula (1) can overcome the disadvantage of polymers having side chains protected by alkoxyalkyl groups (i.e., their low thermal resistance) and the disadvantage of polymers having side chains protected by tert-butoxycarbonyl groups (i.e., their tendency to form a T-top profile).

On the other hand, as an effect of the present invention, the polymeric compounds of the present invention are protected by groups of the above general formula (1) which have acid lability equivalent to that of alkoxyalkyl groups and alkali dissolution-retarding power equivalent to that of the tert-butoxycarbonyl group. Consequently, the alkali solubility of the unexposed regions of the resist film is kept on a sufficiently low level, while elimination reaction of the groups of the above general formula (1) proceeds rapidly in the exposed regions of the resist film, causing a marked increase in alkali dissolution rate as compared with the unexposed regions. Thus, the dissolution contrast can be enhanced and, therefore, high resolution can be achieved.

That is, chemically amplified positive type resist materials using the above-described polymeric compounds as base resins are much less liable to the above-described problems (i.e., a tendency to form a T-top profile and a lack of thermal resistance) than conventional resist materials, and can hence enhance the dissolution contrast of the resist film. Consequently, the present invention provides chemically amplified positive type resist materials which have high sensitivity and high resolution, enable the sizes and shapes of patterns to be arbitrarily controlled according to the composition, and exhibit good process adaptability.

Chemically amplified positive type resist materials using the polymeric compounds of the present invention as base resins are sensitive to high-energy radiation, have high sensitivity, high resolution and excellent resistance to plasma etching, and give resist patterns having high thermal resistance. Moreover, the resulting patterns are less liable to overhang and hence have excellent controllability of size. Accordingly, owing to these characteristics, the chemically amplified positive type resist materials of the present invention can be used as resist materials especially having low absorptivity at the exposure wavelength of a KrF excimer laser. Thus, they can easily form fine patterns having sidewalls perpendicular to the substrate and are hence suitable for use as fine pattern-forming materials in the fabrication of large scale integrated circuits.

DETAILED DESCRIPTION OF PREFERRED EMBODIMENTS

The present invention is more specifically described hereinbelow.

The novel polymeric compound of the present invention is a polymeric compound having a weight-average molecular weight of 1,000 to 500,000 and having one or more hydroxyl and/or carboxyl groups in the molecule, part or all of the hydrogen atoms of the hydroxyl groups and/or the hydrogen atoms of the carboxyl groups being replaced by groups of the following general formula (1):

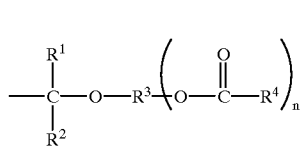

(1)

In the above general formula (1), $R^1$ and $R^2$ are each a hydrogen atom or a straight-chain, branched or cyclic alkyl group of 1 to 6 carbon atoms. Examples of the straight-chain, branched or cyclic alkyl group include methyl, ethyl, propyl, isopropyl, n-butyl, isobutyl, tert-butyl, cyclopentyl and cyclohexyl groups.

$R^3$ is a (n+1)-valent hydrocarbon group of 1 to 18 carbon atoms which may have one or more heteroatoms. Examples thereof include (n+1)-valent groups derived by removing hydrogen atoms from straight-chain, branched or cyclic alkyl groups, aryl groups, alkyl groups having an aryl group, aryl groups having an alkyl group, and oxygen-containing groups (e.g., alkoxyalkyl groups).

$R^1$ and $R^2$, $R^1$ and $R^3$, $R^2$ and $R^3$, or $R^1$, $R^2$ and $R^3$ may form a ring, and in cases of ring formation, $R^1$ and $R^2$ are each a divalent or trivalent hydrocarbon group of 1 to 6 carbon atoms, and $R^3$ is a (n+2)- or (n+3)-valent hydrocarbon group of 1 to 18 carbon atoms which may have a heteroatom.

$R^4$ is a monovalent hydrocarbon or alkoxy group of 1 to 18 carbon atoms which may have one or more heteroatoms. Examples of the hydrocarbon group include straight-chain, branched or cyclic alkyl groups, aryl groups, alkyl groups having an aryl group, aryl groups having an alkyl group, and oxygen-containing groups (e.g., alkoxyalkyl groups), and examples of the alkoxy group include straight-chain, branched or cyclic alkoxy groups.

n is an integer of 1 to 6.

The polymeric compounds to which the present invention is directed should have one or more hydroxyl and/or carboxyl groups.

Specific examples of such polymeric compounds include polyhydroxystyrene, α-methylpolyhydroxystyrene, partially hydrogenated polyhydroxystyrene, partially hydrogenated α-methylpolyhydroxystyrene, polyacrylate resins, polymethacrylate resins, hydroxystyrene-acrylic acid copolymer, hydroxystyrene-methacrylic acid copolymer, α-methylhydroxystyrene-acrylic acid copolymer, α-methylhydroxystyrene-methacrylic acid copolymer and cresol novolac resins.

The reason why the polymeric compound should have a weight-average molecular weight of 1,000 to 500,000 will be described later.

The polymeric compound of the present invention can be a polymeric compound having repeating units of the following general formula (2):

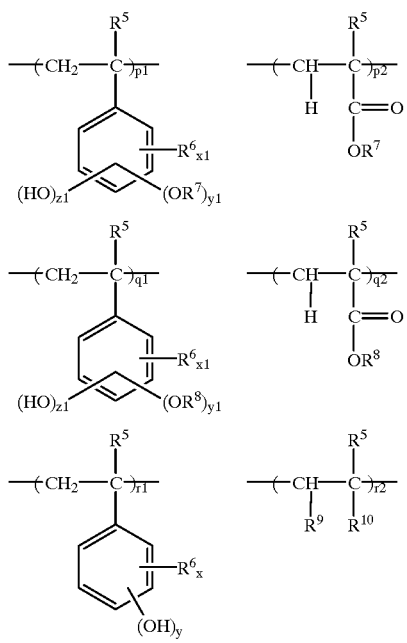

(2)

wherein $R^5$ is a hydrogen atom or a methyl group;

$R^6$ is a straight-chain, branched or cyclic alkyl group of 1 to 8 carbon atoms, preferably of 1 to 5 carbon atoms, more preferably of 1 to 3 carbon atoms. Examples of the straight-chain, branched or cyclic alkyl group include methyl, ethyl, propyl, isopropyl, n-butyl, isobutyl, tert-butyl, cyclopentyl or cyclohexyl;

$R^7$ is a group represented the above general formula (1);

$R^8$ is an acid-labile group;

$R^9$ is a hydrogen atom or a cyano group;

$R^{10}$ is a hydrogen atom, a cyano group, or COOY in which Y is a hydrogen atom or a straight-chain, branched or cyclic alkyl group of 1 to 6 carbon atoms;

$R^9$ and $R^{10}$ may be combined with each other to form 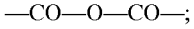—CO—O—CO—;

x is 0 or a positive integer and y is a positive integer, and they satisfy the condition represented by x+y ≦5, but y preferably has a value of 1 to 3 and more preferably 1 or 2; and $x_1$ and $z_1$ are each 0 or a positive integer and $y_1$ is a positive integer, and they satisfy the condition represented by $x_1+y_1+z_1$≦5, but $y_1$ preferably has a value of 1 to 3 and more preferably 1 or 2.

The acid-labile groups represented by $R^8$ may be selected from a variety of such groups. However, among others, groups represented by the following formulae (8) or (9), a tertiary alkyl group of 4 to 20 carbon atoms, a trialkylsilyl group of which each alkyl group is of 1 to 6 carbon atoms, and an oxoalkyl groups of 4 to 20 carbon atoms or the like is preferred.

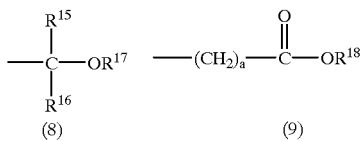

(8)　　　(9)

wherein $R^{15}$ and $R^{16}$ are each a hydrogen atom, or a straight-chain, branched or cyclic alkyl group of 1 to 8 carbon atoms, preferably of 1 to 6 carbon atoms, more preferably 1 to 5 atoms;

$R^{17}$ is a monovalent hydrocarbon group of 1 to 18 carbon atoms, preferably of 1 to 10 carbon atoms, more preferably of 1 to 8 atoms, which may have a heteroatom;

$R^{15}$ and $R^{16}$, $R^{15}$ and $R^{17}$, or $R^{16}$ and $R^{17}$ may form a ring, and in cases of ring formation, $R^{15}$, $R^{16}$ and $R^{17}$ are each a straight-chain or branched alkylene group of 1 to 18 carbon atoms, preferably of 1 to 10 carbon atoms, more preferably of 1 to 8 carbon atoms;

$R^1$ is a tertiary alkyl group of 4 to 20 carbon atoms, preferably of 4 to 15 carbon atoms, more preferably 4 to 10 carbon atoms, a trialkylsilyl group of which each alkyl group is of 1 to 6 carbon atoms, an oxoalkyl group of 4 to 20 carbon atoms, preferably of 4 to 15 carbon atoms, more preferably of 4 to 10, or the group represented by the above formula (8); and a is 0 or an integer of 1 to 6.

Examples of the straight-chain, branched or cyclic alkyl groups of 1 to 6 carbon atoms, which is represented by $R^{15}$ and $R^{16}$, are the groups which were described for $R^1$ and $R^2$.

Examples of the hydrocarbon group represented by $R^{17}$ include straight-chain, branched or cyclic alkyl groups; aryl groups such as phenyl, p-methoxyphenyl, p-methylphenyl and p-ethylphenyl; aralkyl groups such as benzyl or phenethyl; and alkyl groups of the following formulae which have an oxygen atom or in which a hydrogen atom attached to a carbon atom is replaced by a hydroxyl group or two hydrogen atoms are replaced by an oxygen atom to form a carbonyl group.

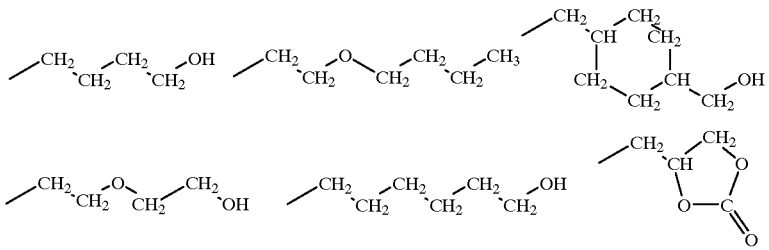

Examples of the tertiary alkyl group of 4 to 20 carbon atoms represented by $R^{18}$ include tert-butyl, 1-methylcyclohexyl, 2-(2-methyl)adamantyl and tert-amyl.

Examples of the trialkylsilyl group of which each alkyl group is of 1 to 6 carbon atoms, represented by $R^{18}$, include trimethylsilyl, triethylsilyl and dimethyl-tert-butylsilyl.

Examples of the oxoalkyl group of 4 to 20 carbon atoms, represented by $R^{18}$, includes a 3-oxoalkyl group and the groups represented by the following formulae.

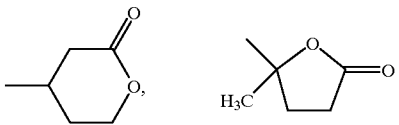

Specific examples of the aforesaid acid-labile groups represented by formula (8) include straight-chain or branched acetal groups such as 1-methoxyethyl, 1-ethoxyethyl, 1-n-propoxyethyl, 1-isopropoxyethyl, 1-n-butoxyethyl, 1-isobutoxyethyl, 1-sec-butoxyethyl, 1-tert-butoxyethyl, 1-tert-amyloxyethyl, 1-cyclohexyloxyethyl, 1-methoxypropyl, 1-ethoxypropyl, 1-methoxy-1-methylethyl and 1-ethoxy-1-methylethyl; and cyclic acetal groups such as 2-tetrahydrofuranyl and 2-tetrahydropyranyl. Among others, 1-ethoxyethyl, 1-n-butoxyethyl and 1-ethoxypropyl are preferred.

On the other hand, specific examples of the aforesaid acid-labile groups represented by formula (9) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl. Specific examples, as acid-labile groups, of the tertiary alkyl group of 4 to 20 carbon atoms, the trialkylsilyl group of which each alkyl group is of 1 to 6 carbon atoms, and the oxoalkyl group of 4 to 20 carbon atoms are the groups which are described for $R^{14}$.

Moreover, in the above formula (2), $p_1$, $p_2$, $q_1$, $q_2$, $r_1$ and $r_2$ are molar proportions and they satisfy the condition represented by $p_1+p_2+q_1+q_2+r_1+r_2=1$. $p_1$, $p_2$, $q_1$, $q_2$, $r_1$ and $r_2$ are each 0 or a positive number, but $p_1$ and $p_2$ cannot be 0 at the same time and $r_1$ and $r_2$ cannot be 0 at the same time, and they satisfy the conditions represented by $0 \leq p_1 \leq 0.8$, $0 \leq p_2 \leq 0.8$, $0 \leq q_1 \leq 0.4$, $0 \leq q_2 \leq 0.4$ and $0 < p_1+p_2+q_1+q_2 \leq 0.8$.

The arrangement of repeating units in the above formula (2) may be either a random arrangement in which each type of units are randomly positioned to form a polymer chain as a whole, or a block arrangement in which each type of units are joined together in sequences to form a polymer chain as a whole.

That is, the polymeric compound of the present invention is one in which part of the hydrogen atoms of the hydroxyl groups present therein and/or the hydrogen atoms of the carboxyl groups present therein are replaced by groups represented by the above general formula (1) and acid-labile groups different from them. However, it is preferable that $(p_1+p_2+q_1+q_2)$ [i.e., the sum of the groups represented by the above general formula (1) and the other acid-labile groups] be greater than 0 mole % and up to 60 mole %, and more preferably in the range of 10 to 50 mole %, based on $(p_1+p_2+q_1+q_2+r_1+r_2)$.

In this case, it is preferable that, on the average, $(p_1+p_2)$ [i.e., the proportion of the groups represented by the above general group (1)] be greater than 0 mole % and up to 60 mole %, and more preferably in the range of 5 to 40 mole %.

If the groups represented by the above general formula (1) are not contained, high dissolution-retarding power may not be achieved, so that the resulting resist material may exhibit low contrast in alkali dissolution rate before and after exposure to light and hence poor resolution. On the other hand, if it is greater than 60 mole %, poor adhesion to the substrate may result owing to a decrease in the number of hydrophilic groups.

With respect to $p_1$, $p_2$, $q_1$ and $q_2$, it is preferable that, on the average, the proportion of the other acid-labile groups be in the range of 0 to 40 mole % and more preferably 0 to 30 mole %. If the proportion of the other acid-labile groups is greater than 40 mole %, the proportion of the groups represented by the above general formula (1) is decreased correspondingly, and they will fail to show their merits (i.e., high dissolution-retarding power and easy eliminability). As a result, the resist material will exhibit low contrast in alkali dissolution rate and hence poor resolution.

The sizes and shapes of patterns can be arbitrarily controlled by determining the proportion of the groups represented by the above general formula (1) to the other acid-labile groups properly within the aforesaid range.

Alternatively, the polymeric compound of the present invention can also be a polymeric compound having repeating units of the following general formula (3):

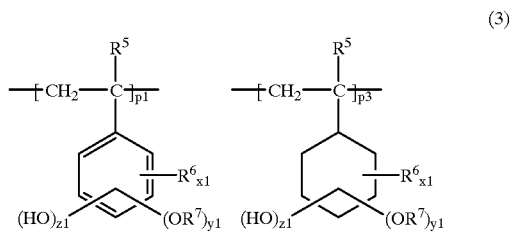

(3)

-continued

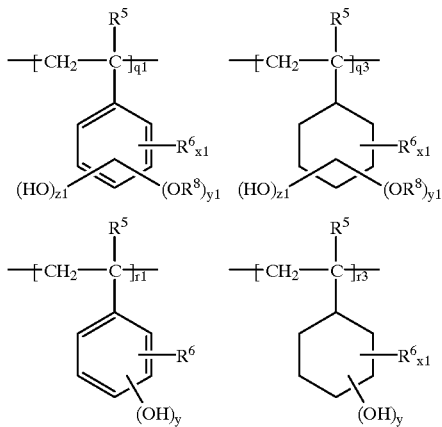

wherein $R^5$, $R^6$, $R^7$, $R^8$, x, y, $x_1$, $y_1$ and $z_1$ have the same meanings as described above, and the preferred ranges for y and $y_1$ are also the same as described above.

$p_1$, $p_3$, $q_1$, $q_3$, $r_1$ and $r_3$ are molar proportions and they satisfy the condition represented by $p_1+p_3+q_1+q_3+r_1+r_3=1$. $p_1$ and $r_1$ are each a positive number, $p_3$, $q_1$, $q_3$ and $r_3$ are each 0 or a positive number, but $p_3$, $q_3$ and $r_3$ cannot be 0 at the same time, and they satisfy the conditions represented by $0<p_1\leq0.8$, $0\leq p_3\leq0.8$, $0\leq q_1\leq0.4$, $0\leq q_3\leq0.4$ and $0<p_1+p_3+q_1+q_3\leq0.8$. For the same reasons as described above, the more preferred range of values are as follows:

It is preferable that $(p_1+p_3+q_1+q_3)$ (i.e., the sum of the groups represented by the above general formula (1) and the other acid-labile groups) be greater than 0 mole % and up to 60 mole %, and more preferably in the range of 10 to 50 mole %, based on $(p_1+p_3+q_1+q_3+r_1+r_3)$.

It is also preferable that, on the average, $(p_1+p_3)$ (i.e., the proportion of the groups represented by the above general group (1)) be greater than 0 mole % and up to 60 mole %, and more preferably in the range of 5 to 40 mole %.

It is also preferable that, on the average, $(q_1+q_3)$ (i.e., the proportion of the other acid-labile groups) be in the range of 0 to 40 mole % and more preferably 0 to 30 mole %. The arrangement of repeating units in the above formula (3) may be either a random arrangement in which each type of units are randomly positioned to form a polymer chain as a whole, or a block arrangement in which each type of units are joined together in sequences to form a polymer chain as a whole.

Also in this case, the sizes and shapes of patterns can be arbitrarily controlled by determining the proportion of the groups represented by the above general formula (1) to the other acid-labile groups properly within the aforesaid range.

Alternatively, the polymeric compound of the present invention can also be a polymeric compound having repeating units of the following general formula (4):

(4)

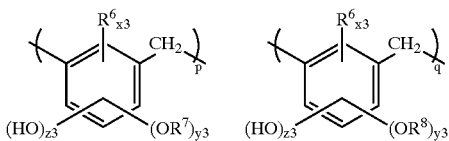

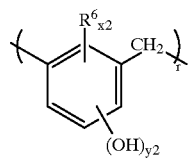

wherein $R^6$, $R^7$ and $R^8$ have the same meanings as described above;

$x_2$ is 0 or a positive integer and $y_2$ is a positive integer, and they satisfy the condition represented by $x_2+y_2\leq4$, but $y_2$ preferably has a value of 1 to 3 and more preferably 1 or 2; and $x_3$ and $z_3$ are each 0 or a positive integer and $y_3$ is a positive integer, and they satisfy the condition represented by $x_3+y_3+z_3\leq4$, but $y_3$ preferably has a value of 1 to 3 and more preferably 1 or 2.

p, q and r are molar proportions and they satisfy the condition represented by $p+q+r=1$. p and r are each a positive number, q is 0 or a positive number, and they satisfy the conditions represented by $0<p\leq0.8$, $0\leq q\leq0.4$ and $0<p+q\leq0.8$. For the same reasons as described above, the more preferred range of values are as follows:

It is preferable that $(p+q)$ (i.e., the sum of the groups represented by the above general formula (1) and the other acid-labile groups) be greater than 0 mole % and up to 60 mole %, and more preferably in the range of 10 to 50 mole %, based on $(p+q+r)$.

It is also preferable that, on the average, p (i.e., the proportion of the groups represented by the above general group (1)) be greater than 0 mole % and up to 60 mole %, and more preferably in the range of 5 to 40 mole %.

It is also preferable that, on the average, q (i.e., the proportion of the other acid-labile groups) be in the range of 0 to 40 mole % and more preferably 0 to 30 mole %.

The arrangement of repeating units in the above formula (4) may be either a random arrangement in which each type of units are randomly positioned to form a polymer chain as a whole, or a block arrangement in which each type of units are joined together in sequences to form a polymer chain as a whole.

Also in this case, the sizes and shapes of patterns can be arbitrarily controlled by determining the proportion of the groups represented by the above general formula (1) to the other acid-labile groups properly within the aforesaid range.

In the polymeric compounds of the present invention, i.e., the polymeric compounds having undergone replacement by groups of the general formula (1) and the polymeric compounds having repeating units of the general formulae (2), (3) and (4), the contents of the groups represented by the above general formula (1) and the other acid-labile groups affect the contrast in the dissolution rate of the resist film and, therefore, are associated with the characteristics of the resist material such as controllability of the sizes and shapes of patterns.

Hydrogen atoms of phenolic hydroxide groups and/or hydrogen atoms of carboxyl groups of the repeating units of the general formula (2) and/or hydrogen atoms of carboxyl groups of the repeating units of the general formulae (3) and/or (4) may be replaced in a range of more than 0 mole % and up to 50 mole %, preferably 0.2 to 30 mole %, more preferably 1 to 20 mole %, for the formation of intramolecular and/or intermolecular crosslikage by a group having a C—O—C group shown as the following general formula (CR1) and/or (OR2).

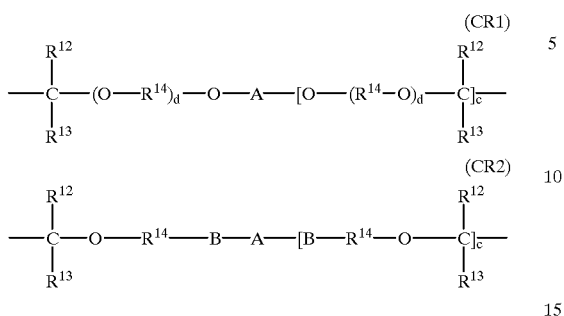

wherein $R^{12}$ and $R^{13}$ are each a hydrogen atom or a straight-chain, branched or cyclic alkyl group of 1 to 8 carbon atoms; $R^{12}$ and $R^{13}$ may form a ring, and in cases of ring formation, $R^{12}$ and $R^{13}$ are each a straight-chain or branched alkylene group of 1 to 8 carbon atoms; $R^{14}$ is a straight-chain or branched alkylene group of 1 to 10 carbon atoms; c is a positive integer of 1 to 7 and d is 0 or a positive integer of 1 to 10; A is a (c+1)-valent aliphatic or alicyclic saturated hydrocarbon group of 1 to 50 carbon atoms, aromatic hydrocarbon group or heterocyclic group, wherein each group may have one or more heteroatoms, or part of hydrogen atoms bonding to carbon atoms of the group may be replaced by hydroxide groups, carboxyl groups, acyl groups or fluoride atoms; B is —CO—O—, —NHCO—O—, or —NHCONH—.

Preferable specific examples of a (c+1)-valent organic groups for A include a hydrocarbon group such as a substitued or nonsubstituted alkylene group of 1 to 50 carbon atoms, preferably 1 to 40 carbon atoms, wherein the substitued alkylene group may contain one or more heteroatoms such as O, NH, $N(CH_3)_3$, S, $SO_2$. The substituted alkylene may include one or more substitutents such as hydroxy, carboxyl, acyl, or fluoro.

Preferable specific examples of a (c+1)-valent organic groups for A also include a hydrocarbon group such as arylene group of 6 to 50 carbon atoms, more preferably 6 to 40 carbon atoms, a group with said alkylene group and said arylene group combined, and a c'-valent (c' is a positive integar of 3 to 8) group with one or more hydrogens on the carbons of the above each group eliminated.

Preferable specific examples of a (c+1)-valent organic groups for A further include a (c+1)-valent heterocyclic group, and a group with the (c+1)-valent heterocyclic group and the hydrocarbon group combined.

Specific examples of A are as follows.

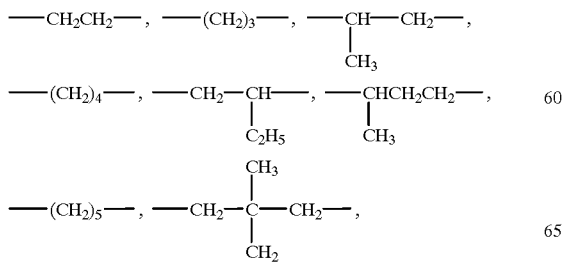

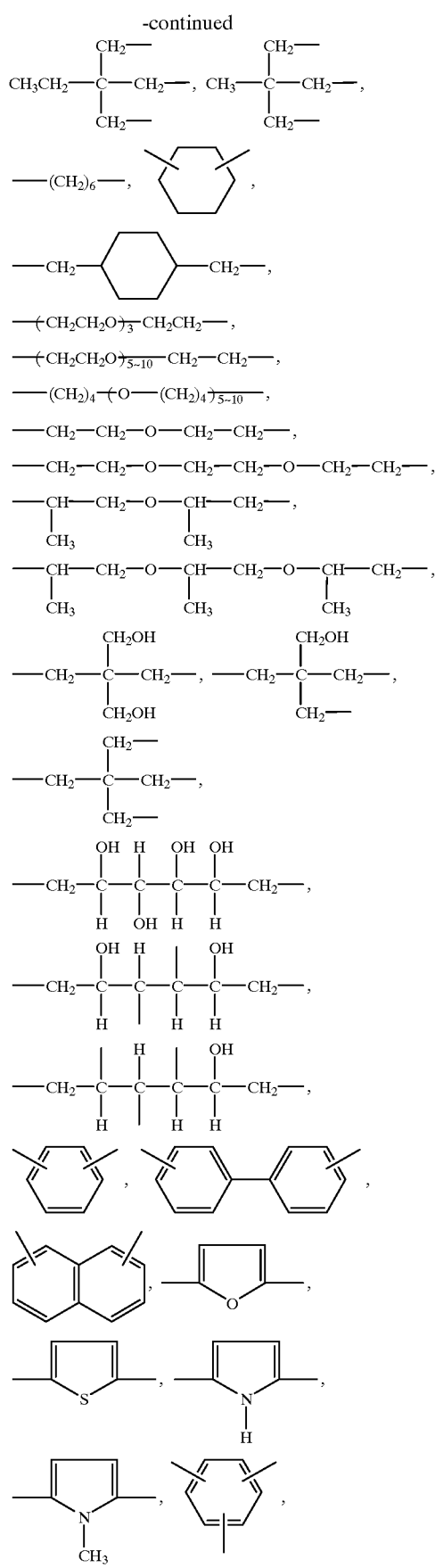

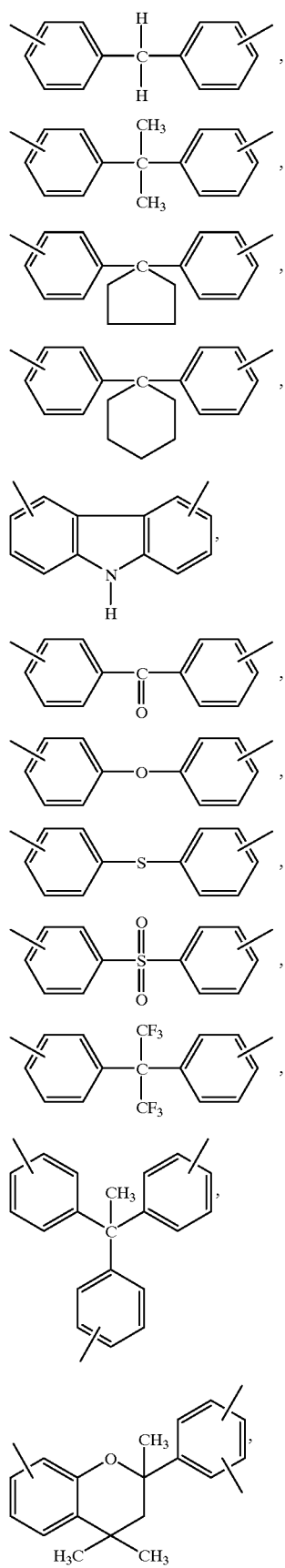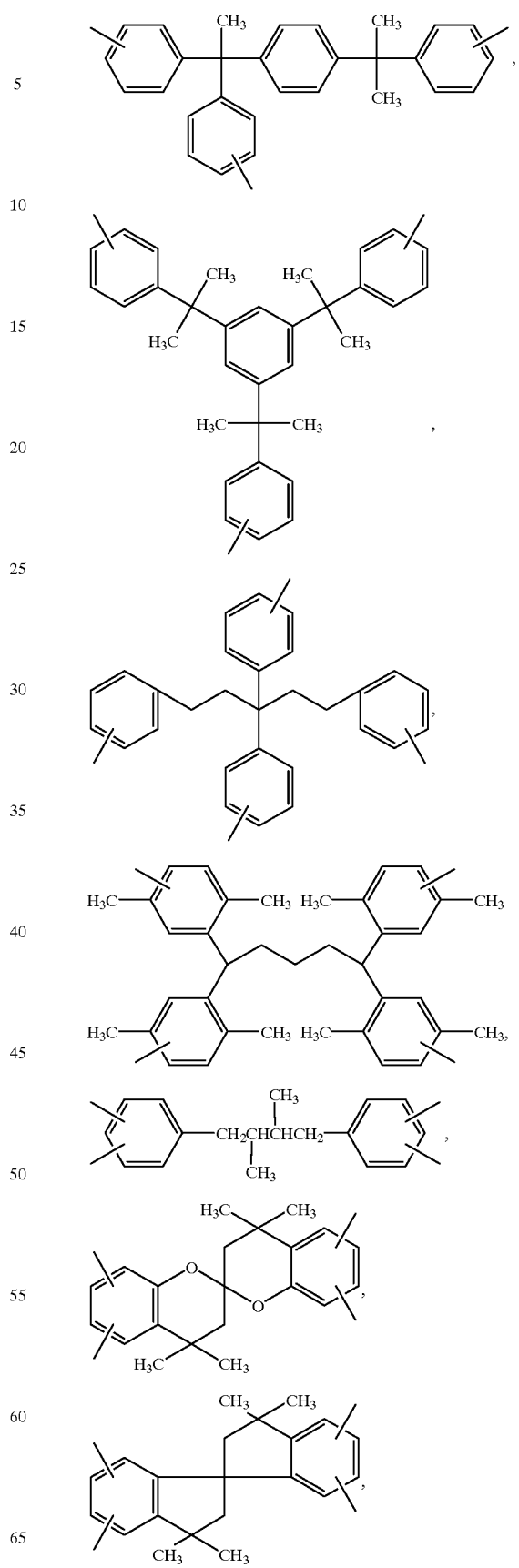

-continued

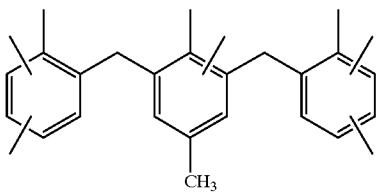

It is obvious that the cross-linking group may be not only divalent but also trivalent to octavalent, based on the value of c for the above formulae (CR1) and (CR2). Examples for a divalent cross-linking group are shown in the formulae (CR3) and (CR4) below, and those for a trivalent cross-linking group are shown in the formulas (CR5) and (CR6).

(CR3)

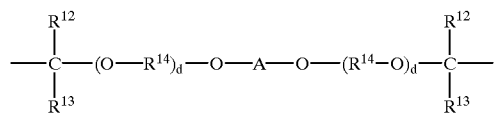

(CR4)

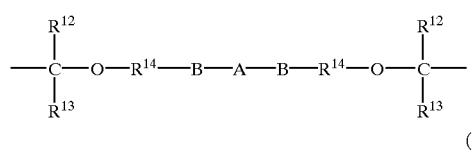

(CR5)

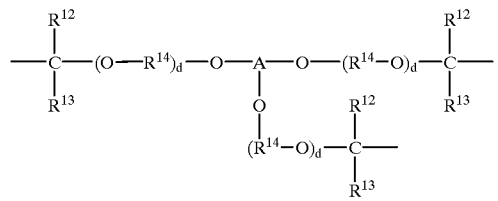

(CR6)

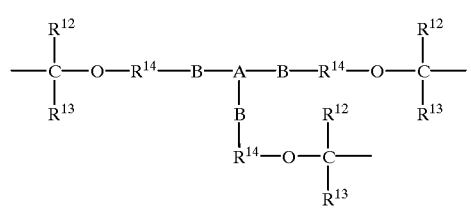

The polymeric compounds of the present invention must have a weight-average molecular weight of 1,000 to 500,000 and preferably 3,000 to 30,000. If the weight-average molecular weight is less than 1,000, the resulting resist material may have poor thermal resistance, and if it is greater than 500,000, the resulting resist material may show a reduction in alkali solubility and hence have poor resolution.

Moreover, with respect to the polymeric compounds of the present invention, lower-molecular-weight and higher-molecular-weight polymers are present therein when the molecular weight distribution (Mw/Mn: a ratio of a weight-average molecular weight Mw to a number-average molecular weight Mn) of the base resin is wide. If a large amount of lower-molecular-weight polymer is present, the resulting resist material may show a reduction in thermal resistance, and if a large amount of higher-molecular-weight polymer is present, the resulting resist material may contain components hardly soluble in alkali and hence leave trails after pattern formation. Thus, as the pattern design rule becomes finer, the molecular weight and molecular weight distribution of the base resin tends to exert a more significant influence. Consequently, the base resin should preferably have a monodispersed molecular weight distribution of 1.0 to 1.5 and more preferably 1.0 to 1.3 in order to obtain a resist material suitable for the formation of patterns of fine size. However, the present invention is not limited thereto, but it is naturally possible to use a polymeric compound having a molecular weight distribution greater than 1.5.

The polymeric compounds of the present invention may be prepared, for example, by using a resin represented by the following general formula (5), (6) or (7) and replacing part of the hydrogen atoms of the hydroxyl groups present therein and/or the hydrogen atoms of the carboxyl groups present therein, successively or simultaneously, by groups represented by the above general formula (1) and other acid-labile groups.

(5)

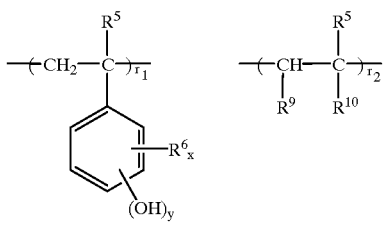

wherein $R^5$ is a hydrogen atom or a methyl group; $R^6$ is a straight-chain, branched or cyclic alkyl group of 1 to 8 carbon atoms; $R^9$ is a hydrogen atom or a cyano group; $R^{10}$ is a hydrogen atom, a cyano group, or COOY in which Y is a hydrogen atom or a straight-chain, branched or cyclic alkyl group of 1 to 6 carbon atoms; $R^9$ and $R^{10}$ may be combined with each other to form —CO—O—CO—; x is 0 or a positive integer and y is a positive integer, and they satisfy the condition represented by $x+y \leq 5$; and $r_1$ and $r_2$ are molar proportions and satisfy the condition represented by $r_1+r_2=1$, provided that both $r_1$ and $r_2$ are each 0 or a positive number, but $r_1$ and $r_2$ cannot be 0 at the same time.

(6)

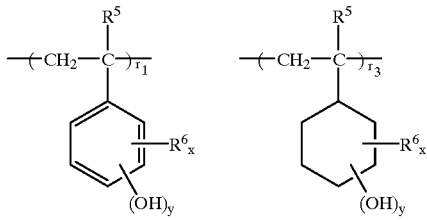

wherein $R^5$, $R^6$, x and y have the same meanings as described above; and $r_1$ and $r_3$ are molar proportions and satisfy the condition represented by $r_1+r_3=1$, provided that $r_1$ and $r_3$ are each a positive number.

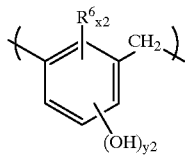

(7)

wherein $R^6$ has the same meaning as described above; and $x_2$ is 0 or a positive integer and $y_2$ is a positive integer, and they satisfy the condition represented by $x_2+y_2 \leq 4$.

In order to replace the hydrogen atoms of the hydroxyl groups and/or the hydrogen atoms of the carboxyl groups by groups represented by the above general formula (1), it is preferable to react the starting resin with an alkenyl ether compound under acid conditions.

Useful alkenyl ether compounds include, but are not limited to, the compounds represented by the following formulae.

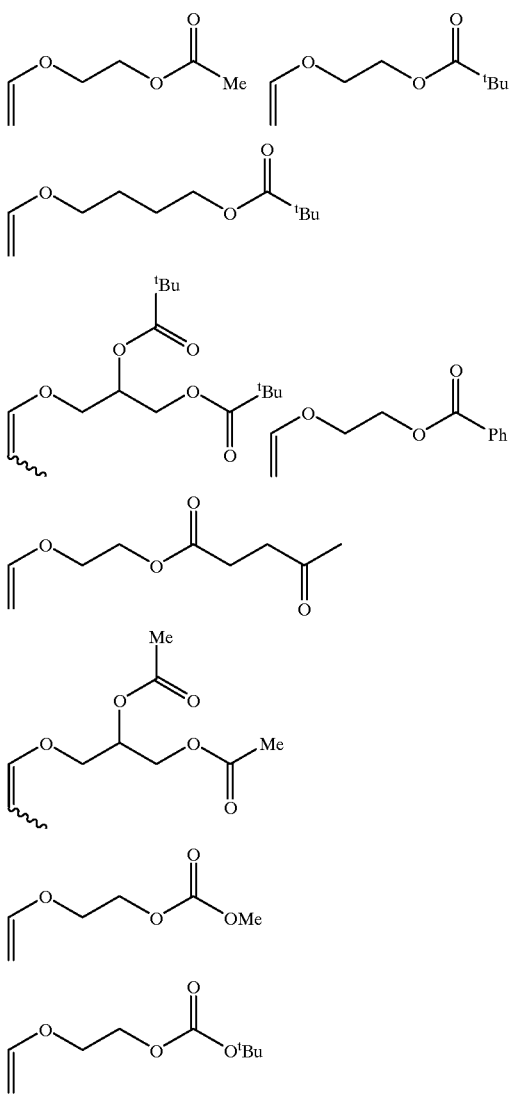

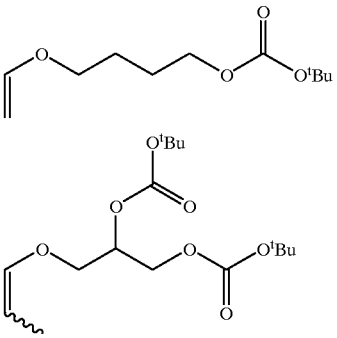

The method using these compounds may be carried out, for example, under the following reaction conditions. Preferred examples of the reaction solvent include N,N-dimethylformamide, N,N-dimethylacetamide, tetrahydrofuran and ethyl acetate. These solvents may be used alone or in admixture of two or more. As the acid, it is preferable to use hydrochloric acid, sulfuric acid, trifluoromethanesulfonic acid, p-toluenesulfonic acid, methanesulfonic acid, pyridinium p-toluenesulfonate or the like. Its amount used is preferably in the range of 0.1 to 10 mole % based on the hydrogen atoms of phenolic hydroxyl groups to be replaced. The reaction temperature is in the range of −20 to 100° C. and preferably 0 to 60° C., and the reaction time is in the range of 0.2 to 100 hours and preferably 0.5 to 20 hours.

The methods for replacing the hydrogen atoms of hydroxyl groups and/or the hydrogen atoms of carboxyl groups by other acid-labile groups can be broadly classified into ones carried out under acid conditions and ones carried out under basic conditions. The reagents used in the methods carried out under acid conditions include, but are not limited to, alkenyl ether compounds, 1,1-dialkylalkenes, α,β-unsaturated carbonyl compounds and the like. The reagents used in the methods carried out under basic conditions include, but are not limited to, halogenated alkyl ethers, acid anhydrides, halogenated trialkylsilanes, tertiary alkyl esters of halogenated alkylcarboxylic acids, and the like.

More specifically, the reagents used in the methods carried out under acid conditions include, but are not limited to, alkenyl ether compounds such as ethyl vinyl ether, n-propyl vinyl ether, isopropyl vinyl ether, n-butyl vinyl ether, isobutyl vinyl ether, sec-butyl vinyl ether, tert-butyl vinyl ether, tert-amyl vinyl ether, cyclohexyl vinyl ether, 1-methoxypropene, 1-ethoxypropene, 2-methoxypropene, 2-ethoxypropene, 3,4-dihydro-2H-pyran and 2,3-dihydrofuran; 1,1-dialkylkenes such as isobutene, 2-methyl-2-butene and 2-methyl-1-butene; and α,β-unsaturated carbonyl compounds such as 2-cyclohexen-1-one and 5,6-dihydro-2H-pyran-2-one.

Preferred examples of the reaction solvent used in the methods carried out under acid conditions include N,N-dimethylformamide, N,N-dimthylacetamide, tetrahydrofuran and ethyl acetate. These solvents may be used alone or in admixture of two or more. As the acid, it is preferable to use hydrochloric acid, sulfuric acid, trifluoromethanesulfonic acid, p-toluenesulfonic acid, methanesulfonic acid, pyridinium p-toluenesulfonate or the like. Its amount used is preferably in the range of 0.1 to 10 mole % based on the hydrogen atoms of phenolic hydroxyl groups to be replaced. The reaction temperature is in the range of −20 to 100° C. and preferably 0 to 60° C., and the reaction time is in the range of 0.2 to 100 hours and preferably 0.5 to 20 hours.

More specifically, the reagents used in the methods carried out under basic conditions include, but are not limited to, halogenated alkyl ethers such as chloromethyl methyl ether, 1-chloroethyl ethyl ether, 1-chloropropyl ethyl ether, 2-chlorotetrahydropyran, 2-chlorotetrahydrofuran and 1-chloroethyl cyclohexyl ether; acid anhydrides such as di-tert-butyl dicarbonate and di-tert-amyl dicarbonate; halogenated trialkylsilanes such as chlorotrimethylsilane, chlorotriethylsilane and chlorodimethyl-tert-butylsilane; tertiary alkyl esters of halogenated alkylcarboxylic acids, such as tert-butyl chloroacetate, tert-amyl chloroacetate, tert-butyl bromoacetate and tert-butyl chloropropionate.

Preferred examples of the reaction solvent used in the methods carried out under basic conditions include aprotic polar solvents such as N,N-dimethylformamide, N,N-dimthylacetamide, dimethyl sulfoxide, acetonitrile, acetone and tetrahydrofuran. These solvents may be used alone or in admixture of two or more. As the base, it is preferable to use triethylamine, pyridine, diisopropylamine, imidazole or anhydrous potassium carbonate. Its amount used is preferably in the range of 110 to 300 mole % based on the hydrogen atoms of phenolic hydroxyl groups to be replaced. The reaction temperature is in the range of −50 to 100° C. and preferably 0 to 80° C., and the reaction time is in the range of 0.5 to 100 hours and preferably 1 to 20 hours.

In the polymeric compounds of the present invention, the acid-labile groups other than the groups represented by the above general formula (1) are not limited to only one type, but two or more types of acid-labile groups may be introduced thereinto. In this case, polymeric compounds having two or more types of acid-labile groups introduced thereinto may be prepared by repeating the above-described procedure two or more times.

The polymeric compounds of the present invention are suitable for use as base polymers in chemically amplified positive type resist materials, and the present invention also provides the following chemically amplified positive type resist materials containing these polymeric compounds as base polymers.

[V] A chemically amplified positive type resist material containing an organic solvent (A), a base resin comprising a polymeric compound as described in [I], [II], [III] or [IV], and an acid generator (C).

[VI] A chemically amplified positive type resist material as described above which further contains, in addition to base resin (B), another base resin (D) comprising a polymeric compound having a weight-average molecular weight of 3,000 to 300,000 and having repeating units of the following general formulae (5) and/or (6) and/or (7), the hydrogen atoms of the hydroxyl groups present therein and/or the hydrogen atoms of the carboxyl groups present therein being partially replaced by acid-labile groups in an overall average proportion of 0 to 80 mole %.

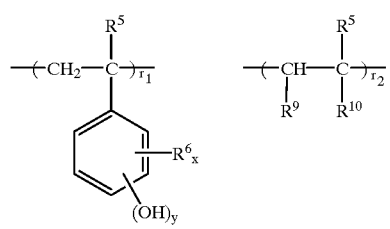

(5)

wherein $R^5$ is a hydrogen atom or a methyl group; $R^6$ is a straight-chain, branched or cyclic alkyl group of 1 to 8 carbon atoms; $R^9$ is a hydrogen atom or a cyano group; $R^{10}$ is a hydrogen atom, a cyano group, or COOY in which Y is a hydrogen atom or a straight-chain, branched or cyclic alkyl group of 1 to 6 carbon atoms; $R^9$ and $R^{10}$ may be combined with each other to form —CO—O—CO—; x is 0 or a positive integer and y is a positive integer, and they satisfy the condition represented by x+y≦5; and $r_1$ and $r_2$ are molar proportions and satisfy the condition represented by $r_1+r_2=1$, provided that $r_1$ and $r_2$ each can be 0 or a positive number, but $r_1$ and $r_2$ cannot be 0 at the same time.

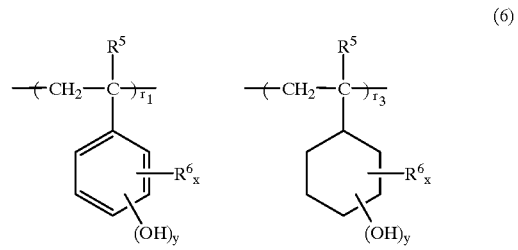

(6)

wherein $R^5$, $R^6$, x and y have the same meanings as described above, and $r_1$ and $r_3$ are molar proportions and satisfy the condition represented by $r_1+r_3=1$, provided that $r_1$ and $r_3$ are each a positive number.

(7)

wherein $R^6$ has the same meaning as described above, $x_2$ is 0 or a positive integer, $y_2$ is a positive integer, and they satisfy the condition represented by $x_2+y_2\leq 4$.

[VII] A chemically amplified positive type resist material as described above which further contains a dissolution inhibitor (E).

[VIII] A chemically amplified positive type resist material as described above which further contains a basic compound (F) as an additive.

[IX] A chemically amplified positive type resist material as described above which further contains an aromatic compound (G) having a group of the formula≡C—COOH as an additive.

[X] A chemically amplified positive type resist material as described above which further contains an ultraviolet absorber (H).

[XI] A chemically amplified positive type resist materail as described above which further contains an acetylene alcohol derivative (I).

The organic solvent (A) used in the present invention can be any organic solvent that can dissolve the acid generator, the base resin, the dissolution inhibitor and the like. Useful organic solvents include, but are not limited to, ketones such as cyclohexanone and n-amyl methyl ketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate and propylene glycol mono-tert-butyl ether acetate. These organic solvents may be used alone or in admixture of two or more. Among these organic solvents, diethylene glycol dimethyl ether and 1-ethoxy-2-propanol are preferably used in the present invention because they have the best dissolving power for the acid generator constituting a resist component. Alternatively, propylene glycol monomethyl ether acetate and solvent mixtures containing it are preferably used because of their safety.

The amount of organic solvent (A) used is preferably in the range of 200 to 1,000 parts by weight, more preferably 400 to 800 parts by weight, per 100 parts by weight of the base resin [the combined amount of base resin (B) and base resin (D); the same shall apply hereinafter].

Specific examples of the acid generator (C) include onium salts of the following general formula (10), diazomethane derivatives of the following general formula (11), glyoxime derivatives of the following general formula (12), β-ketosulfonic acid derivatives, disulfone derivatives, nitrobenzylsulfonate derivatives, sufonic acid ester derivatives and imidoylsulfonate derivatives.

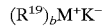  (10)

wherein $R^{19}$ is a straight-chain, branched or cyclic alkyl group of 1 to 12 carbon atoms, a aryl group of 6 to 12 carbon atoms or an aralkyl group of 7 to 12 carbon atoms; $M^+$ is iodonium or sulfonium; $K^-$ is a non-nucleophilic counter ion; and b is 2 or 3.

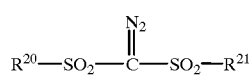  (11)

Wherein $R^{20}$ and $R^{21}$ are each a straight-chain, branched or cyclic alkyl or halogenated alkyl group of 1 to 12 carbon atoms, an aryl or halogenated aryl group of 6 to 12 carbon atoms or an aralkyl group of 7 to 12 carbon atoms.

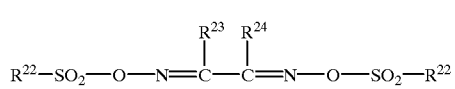  (12)

Wherein $R^{22}$ and $R^{23}$ and $R^{24}$ are each a straight-chain, branched or cyclic alkyl or halogenated alkyl group of 1 to 12 carbon atoms, a aryl group or halogenated aryl group of 6 to 12 carbon atoms or an aralkyl group of 7 to 12 carbon atoms; and $R^{23}$ and $R^{24}$ may form a ring and in cases of ring formation, $R^{23}$ and $R^{24}$ are each a straight-chain or branched alkylene group of 1 to 6 carbon atoms.

The $R^{19}$ of the general formula (10) is a straight-chain, branched or cyclic alkyl group of 1 to 12 carbon atoms, an aryl group of 6 to 12 carbon atoms or an aralkyl group of 7 to 12 carbon atoms.

Examples of the straight-chain, branched or cyclic alkyl group of 1 to 12 carbon atoms of the formula (10) include methyl, ethyl, propyl, butyl, cyclohexyl, 2-oxocyclohexyl, norbornyl and adamantyl.

Examples of the aryl group of 6 to 12 carbon atoms of the formula (10) include an alkoxy phenyl group such as phenyl, p-methoxyphenyl, m-methoxyphenyl, o-methoxyphenyl, ethoxyphenyl, p-tert-butoxyphenyl, m-tert-butoxyphenyl; and an alkyl phenyl group such as 2-methylphenyl, 3-methylphenyl, 4-methylphenyl, ethylphenyl, 4-tert-butylphenyl, 4-butylphenyl and dimethylphenyl.

Examples of the aralkyl group of 7 to 12 carbon atoms of the formula (10) include benzyl and phenethyl.

Examples of the non-nucleophilic counter ion for $K^-$ of the formula (10) include a halide ion such as a chloride ion and a bromide ion; a fluoroalkylsulfonate group such as triflate, 1,1,1-trifluoroethanesulfonate and nonafluorobutanesulfonate;
an arylsulfonate group such as tosylate, benzenesulfonate, 4-fluorobenzenesulfonate, and 1,2,3,4,5-pentafluorobenzenesulfonate; and an alkylsulfonate such as mesylate and butanesulfonate.

Specific examples of the onium ion of the general formula (10) include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate and dicyclohexylphenylsulfonium p-tolu enesulfonate;

The $R^{20}$ and $R^2 1$ of the general formula (11) are each a straight-chain, branched or cyclic alkyl or halogenated alkyl group of 1 to 12 carbon atoms, an aryl or halogenated aryl group of 6 to 12 carbon atoms or an aralkyl group of 7 to 12 carbon atoms.

Examples of the straight-chain, branched or cyclic alkyl group of 1 to 12 carbon atoms of the formula (11) include methyl, ethyl, propyl, butyl, amyl, cyclopentyl, cyclohexyl, norbornyl and adamantyl.

Examples of the straight-chain, branched or cyclic halogenated alkyl group of 1 to 12 carbon atoms of the formula (11) include trifluoromethyl, 1,1,1-trifluoroethyl, 1,1,1-trichloroethyl and nonafluorobutyl.

Examples of the aryl group of 6 to 12 carbon atoms of the formula (11) include an alkoxy phenyl group such as phenyl, p-methoxyphenyl, m-methoxyphenyl, o-methoxyphenyl, ethoxyphenyl, p-tert-butoxyphenyl, m-tert-butoxyphenyl; and an alkylphenyl group such as 2-methylphenyl, 3-methylphenyl, 4-methylphenyl, ethylphenyl, 4-tert-butylphenyl, 4-butylphenyl and dimethylphenyl.

Examples of the halogenated aryl group of 6 to 12 carbon atoms of the formula (11) include fluorophenyl, chlorophenyl and 1,2,3,4,5-pentafluorophenyl.

Examples of the aralkyl group of the formula (11) include benzyl and phenethyl.

Examples of the diazomethane derivatives for the general formula (11) include bis(benzenesulfonyl)diazomethane, bis (p-toluenesulfonyl)diazomethane, bis(xylenesulfonyl) diazomethane, bis(cyclohexylsulfonyl)diazomethane, bis-(cyclopentylsufonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, bis (tert-butylsulfonyl)diazomethane, bis(n-amylsufonyl) diazomethane, bis(isoamylsulfonyl)diazomethane, bis(sec-amylsufonyl)diazomethane, bis(tert-amylsulfonyl) diazomethane, 1-cyclohexylsufonyl-1-(tert-butylsulfonyl) diazomethane, 1-cyclohexylsulfonyl-1-(tert-amylsulfonyl) diazomethane, 1-tert-amylsulfonyl-1-(tert-butylsulfonyl) diazomethane.

The $R^{22}$ and $R^{23}$ and $R^{24}$ of the general formula (12) are each a straight-chain, branched or cyclic alkyl or halogenated alkyl group of 1 to 12 carbon atoms, a aryl or halogenated aryl group of 6 to 12 carbon atoms or an aralkyl group of 7 to 12 carbon atoms; and $R^{23}$ and $R^{24}$ may form a ring and in cases of ring formation, $R^{23}$ and $R^{24}$ are each a straight-chain or branched alkylene group of 1 to 6 carbon atoms.

Examples of the alkyl group, the halogenated alkyl group, the aryl group, the halogenated aryl group and the aralkyl group of $R^{22}$, $R^{23}$ and $R^{24}$ include those which are described for $R^{20}$ and $R^{21}$.

Examples of the alkylene group of $R^{23}$ and $R^{24}$ include methylene, ethylene, propylene, butylene and hexylene.

Examples of the glyoxime derivatives for the general formula (12) include bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylgyloxime, bis-o-(n-butanesulfonyl)-2,3-pentadioneglyoxime, bis-o-(n-butanesulfonyl)-2-methyl-3,4-pentadioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethyl-glyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesufonyl)-α-dimethylglyoxime, bis-o-(p-flurobenzenesulfonyl)-α-dimethylglyoxime, bis-o-(p-tert-butylbenzenesulfonyl)-α-dimethylglyoxime, bis-o-(xylenesulfonyl)-α-dimethylglyoxime and bis-o-(camphorsulfonyl)-α-dimethylglyoxime.

The acid generator (C) also include β-ketosulfone derivatives, disulfone derivatives, nitrobenzyl sulfonate derivatives, sulfonic acid ester derivatives and imide-yl sulfonate derivatives.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate Examples of the sulfonic acid ester derivatives include 1,2,3-tris(methanesulfonyloxy)benzene, 1,2,3-tris (trifluoromethanesulfonyloxy)benzene and 1,2,3-tris(p-toluenesulfonyloxy)benzene.

Examples of the imide-yl sulfonate derivatives include phthalimide-yl triflate, phthalimide-yl tosylate, 5-norbornene-2,3-dicarboximide-yl triflate, 5-norbornene-2,3-dicarboximide-yl tosylate and 5-norbornene-2,3-dicarboximide-yl n-butylsulfonate.

Among them, the onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate and tris(p-tert-butoxyphenyl)sulfonium p-toluenesulfonate; the diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; and the glyoxime derivatives such as bis-o-(p-toluenesulfonyl)-α-dimethylglyoxime and bis-o-(n-butanesulfonyl)-α-dimethylglyoxime are preferably used.

The above-described acid generator may be used alone or in admixture of two or more.

The onium salts excels in an effect of enhancing rectangularity, while the diazomethane derivatives and the glyoxime derivatives excel in an effect of decreasing standing wave. Combining them can carry out fine control of a profile.

The amount of acid generator (C) used is preferably in the range of 0.5 to 15 parts by weight, more preferably 1 to 8 parts by weight, per 100 parts by weight of the base resin. If the amount of acid generator used is less than 0.5 part by weight, the resulting resist material may have unduly low sensitivity. If it is greater than 15 parts by weight, the resulting resist material may have unduly low resolution owing to a reduction in alkali dissolution rate. Moreover, the monomer component or components, which are present in excess, may cause a reduction in thermal resistance.

As the base resin (D) other than the polymeric compound constituting the base resin (B), it is especially preferable to use a polymeric compound having a weight-average molecular weight of 3,000 to 300,000 and having repeating units of the following general formula (13) in which the hydrogen atoms of the hydroxyl groups and/or carboxyl groups present therein are partially replaced by acid-labile groups.

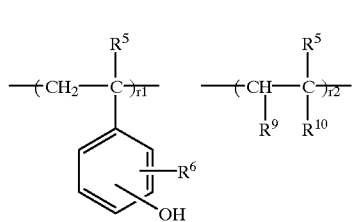

(13)

wherein $R^5$, $R^6$, $R^9$ and $R^{10}$ have the same meanings as described above; and $r_1$ and $r_2$ are molar proportions and satisfy the condition represented by $r_1+r_2=1$, provided that $r_1$ and $r_2$ are each 0 or a positive number, but $r_1$ and $r_2$ cannot be 0 at the same time. The acid-labile groups may be selected from a variety of such groups. However, among others, groups represented by the above formulae (8) and (9), tertiary alkyl groups of 4 to 20 carbon atoms, trialkylsilyl groups of which each alkyl group has 1 to 6 carbon atoms and oxoalkyl groups of 4 to 20 carbon atoms are preferred. Of these groups, one or two types of groups are preferably introduced. The overall average degree of substitution is preferably in the range of 0 to 80 mole % and more preferably 10 to 60 mole %. If the degree of substitution is greater than 60 mole % or less than 10 mole %, the resulting resist material may exhibit low contrast in alkali dissolution rate and hence poor resolution. The sizes and shapes of patterns can be arbitrarily controlled by determining the degree of substitution properly within the aforesaid range.

Alternatively, as the base resin (D), it is also especially preferable to use a polymeric compound having a weight-average molecular weight of 3,000 to 300,000 and having repeating units of the following general formula (14) in which the hydrogen atoms of the hydroxyl groups present therein are partially replaced by acid-labile groups.

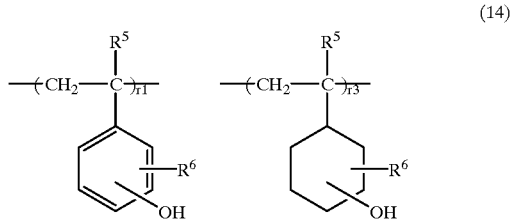

(14)

wherein $R^5$ and $R^6$ have the same meanings as described above; and $r_1$ and $r_3$ are molar proportions and satisfy the condition represented by $r_1+r_3=1$, provided that $r_1$ and $r_3$ are each a positive number. The acid-labile groups may be selected from a variety of such groups. However, among others, groups represented by the above formulae (8) and (9), tertiary alkyl groups of 4 to 20 carbon atoms, trialkylsilyl groups of which each alkyl is of 1 to 6 carbon atoms and oxoalkyl groups of 4 to 20 carbon atoms are preferred. Of these groups, one or two types of groups are preferably introduced. The overall average degree of substitution is preferably in the range of 0 to 80 mole % and more preferably 0 to 60 mole %. If the degree of substitution is greater than 60 mole %, the resulting resist material may exhibit low contrast in alkali dissolution rate and hence poor resolution. The dimensions and shapes of patterns can be arbitrarily controlled by determining the degree of substitution properly within the aforesaid range.

Alternatively, as the base resin (D), it is also especially preferable to use a polymeric compound having a weight-average molecular weight of 3,000 to 300,000 and having repeating units of the following general formula (15) in which the hydrogen atoms of the hydroxyl groups present therein are partially replaced by acid-labile groups.

(15)

wherein $R^6$ has the same meaning as described above. The acid-labile groups may be selected from a variety of such groups. However, among others, groups represented by the above formulae (8) and (9), tertiary alkyl groups of 4 to 20 carbon atoms, trialkylsilyl groups of which each alkyl is of 1 to 6 carbon atoms and oxoalkyl groups of 4 to 20 carbon atoms are preferred. Of these groups, one or two types of groups are preferably introduced. The overall average degree of substitution is preferably in the range of 0 to 80 mole % and more preferably 0 to 60 mole %. If the degree of substitution is greater than 60 mole %, the resulting resist material may exhibit low contrast in alkali dissolution rate and hence poor resolution. The dimensions and shapes of patterns can be arbitrarily controlled by determining the degree of substitution properly within the aforesaid range.

These polymeric compounds of the general formulae (13) to (15) must have a weight-average molecular weight of 3,000 to 300,000 and preferably 5,000 to 30,000. If the weight-average molecular weight is less than 3,000, the resulting resist material may have poor thermal resistance, and if it is greater than 300,000, the resulting resist material may show a reduction in alkali solubility and hence have poor resolution.

Moreover, also with respect to the base resin (D), lower-molecular-weight and higher-molecular-weight polymers are present therein when its molecular weight distribution (Mw/Mn) is wide. If a large amount of lower-molecular-weight polymer is present, the resulting resist material may show a reduction in thermal resistance, and if a large amount of higher-molecular-weight polymer is present, the resulting resist material may contain components hardly soluble in alkali and hence leave trails after pattern formation. Thus, as the pattern design rule becomes finer, the molecular weight and molecular weight distribution of the base resin tends to exert a more significant influence. Consequently, the base resin should preferably have a narrow molecular weight distribution of 1.0 to 2.5 and more preferably 1.0 to 1.5 in order to obtain a resist material suitable for the formation of patterns of fine size.

The base resin (D) and the base resin (B) are preferably used in a weight ratio of 0:100 to 90:10 and more preferably 0:100 to 50:50. If the amount of base resin (D) used is greater than that defined by the aforesaid weight ratio, the base resin (B) may fail to produce the desired effect.

The resist material of the present invention may further contain a dissolution inhibitor (or dissolution controller) (E). As the dissolution inhibitor (E), there is used a compound having an average molecular weight of 100 to 1,000, preferably 150 to 800, and having two or more phenolic hydroxyl groups in the molecule in which the hydrogen atoms of the phenolic hydroxyl groups are replaced by acid-labile groups to an overall average degree of substitution of 0 to 100%.

The average degree of substitution to which the hydrogen atoms of the phenolic hydroxyl groups are replaced by acid-labile groups is not less than 0 mole %, preferably not less than 30 mole %, based on all of the phenolic hydroxyl groups. Its upper limit is 100 mole % and preferably 80 mole %.

In this case, preferred examples of such compounds having two or more phenolic hydroxyl groups are the compounds represented by the following formulae (i) to (xi).

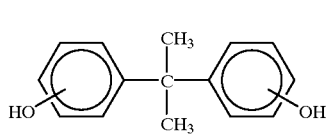

(i)

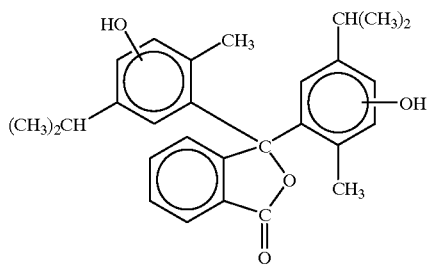
(ii)

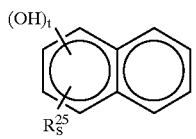
(iii)

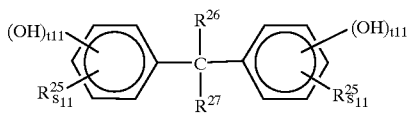
(iv)

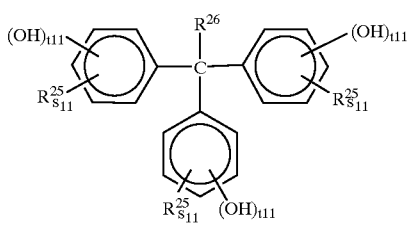
(v)

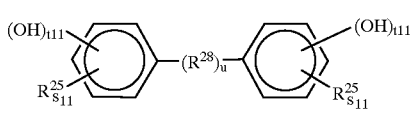
(vi)

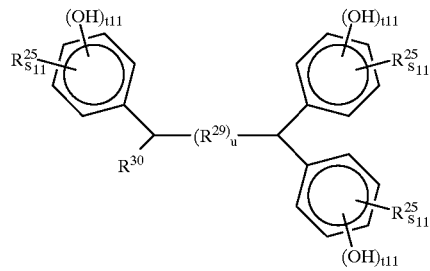
(vii)

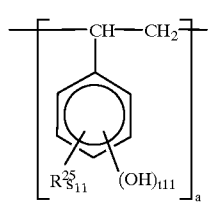
(viii)

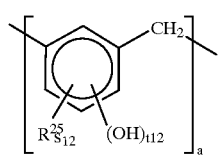
(ix)

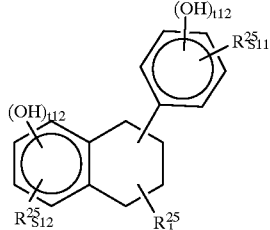
(x)

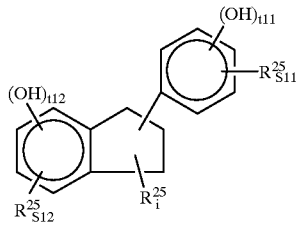
(xi)

wherein $R^{25}$ and $R^{26}$ are each a hydrogen atom, or a straight-chain or branched alkyl or alkenyl group of 1 to 8 carbon atoms;

$R^{27}$ is a hydrogen atom, or a straight-chain or branched alkyl or alkenyl group of 1 to 8 carbon atoms, or —$(R^{31})_h$—COOH;

$R^{28}$ is —$(CH_2)_i$— (i is an interger of 2 to 10), an arylene group of 6 to 10 carbon atoms, a carbonyl group, a sulfonyl group, an oxygen atom or a sulfur atom;

$R^{29}$ is an alkylene group of 1 to 10 carbon atoms, an arylene group of 6 to 10 carbon atoms, a carbonyl group, a sulfonyl group, an oxygen atom or a sulfur atom;

$R^{30}$ is a hydrogen atom, an alkyl or alkenyl group of 1 to 8 carbon atoms, or a phenyl or naphthyl group having one or more hydroxyl groups;

$R^{31}$ is a straight-chain or branched alkylene group of 1 to 10 carbon atoms;

j is an integer of 0 to 5, h is 0 or 1, and u is 0 or 1;

s, t, $S_{11}$, $t_{11}$, $s_{12}$ and $t_{12}$ are numbers which satisfy the conditions represented by s+t=8, $S_{11}$+$t_{11}$=5 and $s_{12}$+$t_{12}$=4 and which cause each phenyl skeleton to have at least one hydroxyl group; and α is a number which causes the compound of formula (viii) or (ix) to have a molecular weight of 100 to 1,000.

In the above formulae, specific examples of $R^{25}$ and $R^{26}$ include hydrogen, methyl, ethyl, butyl, propyl, ethynyl and cyclohexyl.

Specific examples of $R^{27}$ include the same groups as described for $R^{25}$ and $R^{25}$, —COOH and —$CH_2$COOH.

Specific examples of $R^{28}$ include ethylene, phenylene, carbonyl, sulfonyl, oxygen and sulfur.

Specific examples of $R^{29}$ include methylene and the same groups as described for $R^{28}$.

Specific examples of $R^{30}$ include hydrogen, methyl, ethyl, butyl, propyl, ethynyl, cyclohexyl, hydroxyl-substituted phenyl and hydroxyl-substituted naphthyl.

The acid-labile groups which may be present in the dissolution inhibitor include groups represented by the above formulae (8) and (9), tertiary alkyl groups of 4 to 20 carbon atoms, trialkylsilyl groups of which each alkyl group is of 1 to 6 carbon atoms, oxoalkyl groups of 4 to 20 carbon atoms and the like.

The above-described compound in which the hydrogen atoms of the phenolic hydroxyl groups are partially replaced by acid-labile groups (i.e., dissolution inhibitor) is used in an amount of greater than 0 part by weight and up to 50 parts by weight, preferably 5 to 50 parts by weight, and more preferably 10 to 30 parts by weight, per 100 parts by weight of the base resin. The dissolution inhibitor may comprise a single compound or a mixture of two or more compounds. If the amount of dissolution inhibitor used is greater than 50 parts by weight, the resulting resist material may undergo a film thinning of the pattern and hence show a reduction in resolution. However, the desired effects (e.g., high resolution) may be obtained even if the dissolution inhibitor is used in an amount of 0 part by weight per 100 parts of the base resin (i.e., it is not added at all), so that the dissolution inhibitor is added where required.

The above-described dissolution inhibitor may be prepared by chemically reacting a compound having two or more phenolic hydroxyl groups with acid-labile groups in the same manner as described for the base resin.

In place of, or in addition to, the above-described dissolution inhibitor, the resist material of the present invention may contain another dissolution inhibitor comprising a compound having a weight-average molecular weight of greater than 1,000 and up to 3,000 and having phenolic hydroxyl groups in the molecule in which the hydrogen atoms of the phenolic hydroxyl groups are partially replaced by acid-labile groups at an overall average degree of 0 to 60%.

In this case, the above-described compound in which the hydrogen atoms of the phenolic hydroxyl groups are partially replaced by acid-labile groups preferably comprises one or more compounds selected from the compounds having a weight-average molecular weight of greater than 1,000 and up to 3,000 and having repeating units of the following general formulae (16), (17) and (18).

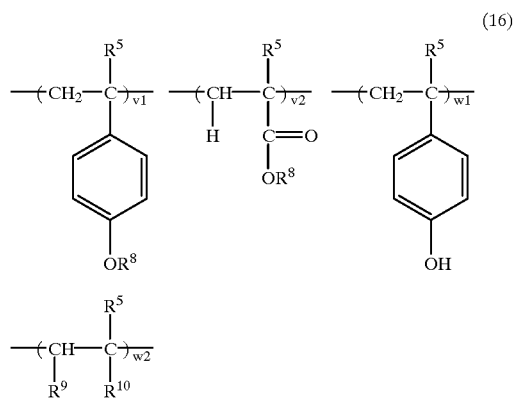

(16)

wherein $R^5$, $R^9$ and $R^{10}$ have the same meanings as described above; $R^8$ is an acid-labile group; and $v_1$, $v_2$, $w_1$ and $w_2$ are numbers which satisfy the conditions represented by $0 \leq (v_1+v_2)$, $(v_1+v_2)/(v_1+v_2+w_1+w_2) \leq 6$.

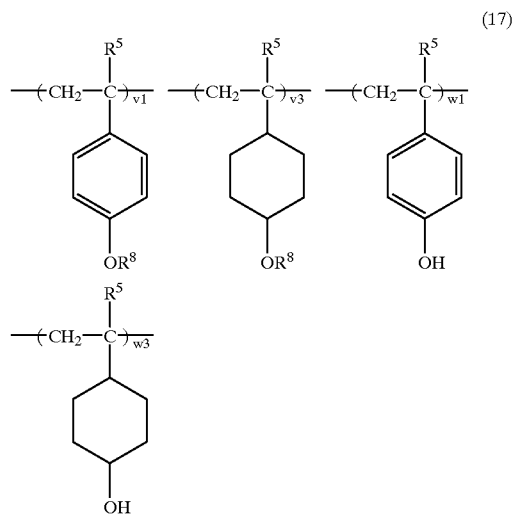

(17)

wherein $R^5$ has the same meaning as described above; $R^8$ is an acid-labile group; and $v_1$, $v_3$, $w_1$ and $w_3$ are numbers which satisfy the conditions represented by $0 \leq (v_1+v_3)$, $(v_1+v_3)/(v_1+v_3+w_1+w_3) \leq 0.6$.

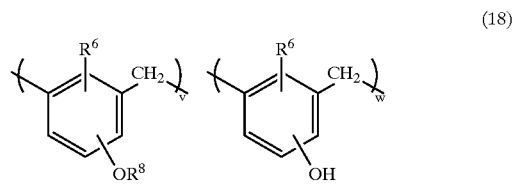

(18)

wherein $R^6$ has the same meaning as described above; $R^8$ is an acid-labile group; and v and w are numbers which satisfy the condition represented by $0 < v/(v+w) \leq 0.6$.

The acid-labile groups which may be present in the above-described dissolution inhibitor include groups represented by the above formulae (8) and (9), tertiary alkyl groups of 4 to 20 carbon atoms, trialkylsilyl groups of which each alkyl group is of 1 to 6 carbon atoms, oxoalkyl groups of 4 to 20 carbon atoms and the like.

The above-described other dissolution inhibitor is used in such an amount that the combined amount of the above-described dissolution inhibitor and the above-described other dissolution inhibitor is in the range of 0 to 50 parts by weight, preferably 0 to 30 parts by weight, and more preferably 1 to 30 parts by weight, per 100 parts by weight of the base resin.

The above-described other dissolution inhibitor may be prepared by chemically reacting a compound having phenolic hydroxyl groups with acid-labile groups in the same manner as described for the base resin.

Moreover, the resist material of the present invention may contain a basic compound (F).

This basic compound (F) used as an additive should suitably comprise a compound which can decrease the rate at which the acid produced by the acid generator diffuses through the resist film. As a result of the addition of such a basic compound, the rate of diffusion rate of the acid through the resist film is decreased to improve the resolution, so that the change in sensitivity after exposure to light can be minimized, the dependence on the substrate and the environment can be reduced, and the exposure latitude and the resulting pattern profile can be improved.

Such basic compounds include primary, secondary and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives and the like.

Specific examples of primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine,. methylenediamine, ethylenediamine and tetraethylene pentamine; specific examples of secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine and N,N-dimethyltetraethylene pentamine; and specific examples of tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine and N,N,N',N'-tetramethyltetraethylene pentamine.

Specific examples of mixed amines include dimethylethylamine, methylethylpropylamine, benzylamine, phenetylamine and benzyldimethylamine. Specific examples of aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline and N,N-dimethyltoluidine); diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole and N-methylpyrrole), oxazole derivatives (e.g., oxazole and isoxazole), thiazole derivatives (e.g., thiazole and isothiazole), imidazole derivatives (e.g., imidazole, 4-methylimidazole and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine and dimethylaminopyridine), pyridazine derivatives pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives and uridine derivatives.

Specific examples of nitrogen-containing compounds having a carboxyl group include aminobenzoic acid, indole-carboxylic acid and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid and methoxyalanine); specific examples of nitrogen-containing compounds having a sulfonyl group include 3-pyridinesulfonic acid and pyridinium p-toluenesulfonate; and specific examples of nitrogen-containing compounds having a hydroxyl group, nitrogen-containing compounds having a hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide. Specific examples of amide derivatives include formamide, N-methylformamide, N,N-dimethylformamide, acetamide, N-methylacetamide, N,N-dimethylacetamide, propionamide and benzamide. Specific examples of imide derivatives include phthalimide, succinimide and maleimide.

The basic compound of the following general formula (AM1) or (AM2) can be added.

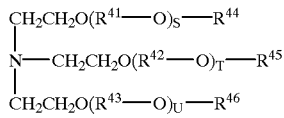

(AM1)

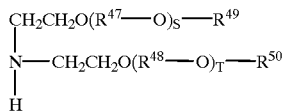

(AM2)

wherein $R^{41}$, $R^{42}$, $R^{43}$, $R^{47}$ and $R^{48}$ are each independently a straight-chain, branched or cyclic alkylene group of 1 to 20 carbon atoms; $R^{44}$, $R^{45}$, $R^{46}$, $R^{49}$ and $R^{50}$ are each a hydrogen atom, or an alkyl or amino group of 1 to 20 carbon atoms; $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ may each form a ring through bonding; S, T and U are each an integer of 0 to 20. When all of S, T and U are zero, however, none of $R^{44}$, $R^{45}$, $R^{46}$, $R^{49}$ and $R^{50}$ contain a hydrogen.

The alkylene group for $R^{41}$, $R^{42}$, $R^{43}$, $R^{47}$ and $R^{48}$ are of 1 to 20 carbon atoms, preferably 1 to 10 carbon atoms, more preferably 1 to 8 and the specific examples thereof include methylene, ethylene, n-propylene, isopropylene, n-butylene, isobutylene, n-pentylene, isopentylene, hexylene, nonylene, decylene, cyclopentylene and cyclohexylene.

The alkyl group for $R^{44}$, $R^{45}$, $R^{46}$, $R^{49}$ and $R^{50}$ are of 1 to 20 carbon atoms, preferably 1 to 8 carbon atoms, more preferably 1 to 6, and may be a straight-chain, branched or cyclic group. The specific examples thereof include methyl, ethyl, n-propyl, isopropyl, n-butyl, isobutyl, tert-butyl, n-pentyl, isopentyl, hexyl, nonyl, decyl, dodecyl, tridecyl, cyclopentyl and cyclohexyl.

When $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ each forms a ring, the ring may contain 1 to 20 carbon atoms, preferably 1 to 8 carbon atoms, more preferably 1 to 6, and may contain a branched alkyl group of 1 to 6 carbons, preferably 1 to 4 carbons.

S, T and U are each an integer of 0 to 20, preferably 1 to 10, more preferably 1 to 8.

Examples of the compounds of the formulae (13) and (14) include tris{2-(methoxymethoxy)ethyl}amine, tris{2-(methoxyethoxy)ethyl}amine, tris[2-{(2-methoxyethoxy)methoxy}ehtyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5.]eicosan, 1,4,10,13-teraoxa-7,16-diazabicyclooctadecane, 1-aza-12-crown-4, 1-aza-15-crown-5 and 1-aza-18-crown-6.

Preferable examples of the compounds of the formulae (13) and (14) include tertiary amines, aniline derivatives, pyrrolidine derivatives, pyridine derivatives, quinoline derivatives, amino acid derivatives, nitrogen-containing compounds having a hydroxy group, nitrogen-containing compounds having a hydroxyphenyl, alcoholic nitrogen-containing compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine and 1-aza-15-crown-5.

The above-described basic compounds (F) may be used alone or in admixture of two or more. The amount of basic compound (F) used is preferably be in the range of 0 to 2 parts by weight, more preferably 0.01 to 1 part by weight, per 100 parts by weight of the base resin. If the amount of basic compound (F) used is greater than 2 parts by weight, the resulting resist material may have unduly low sensitivity.

Furthermore, the resist material of the present invention may contain an aromatic compound (G) having a group of the formula ≡C—COOH in the molecule as a component.

This aromatic compound having a group of the formula ≡C—COOH in the molecule, which is used as component (G), may comprise, but is not limited to, one or more compounds selected from the following two classes of compounds.

[Class I]

The compounds represented by the following general formulae (19) to (28) in which part or all of the hydrogen atoms of the phenolic hydroxyl groups present therein are replaced by —$R^{25}$—COOH groups (wherein $R^{25}$ is a straight-chain or branched alkylene group of 1 to 10 carbon atoms) and in which, when the number of moles of the phenolic hydroxyl groups present in the molecule is designated by $A_1$ and the number of moles of the ≡C—COOH groups present in the molecule by $A_2$, the molar ratio $A_1/(A_1+A_2)$ is equal to 0.1–1.0.

(19)
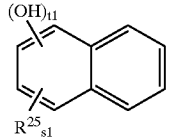

(20)
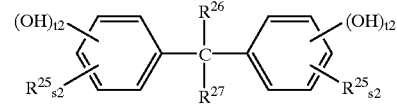

(21)
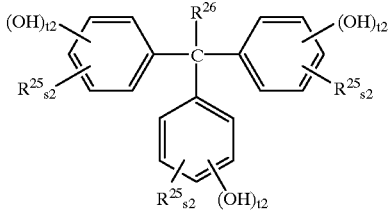

(22)
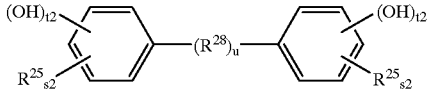

(23)
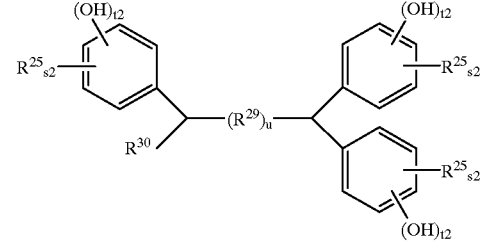

(24)
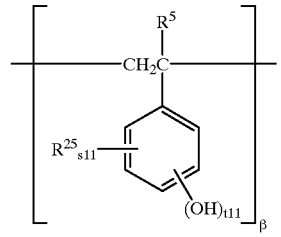

(25)
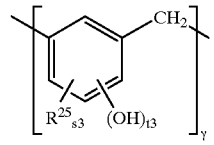

-continued

(26)
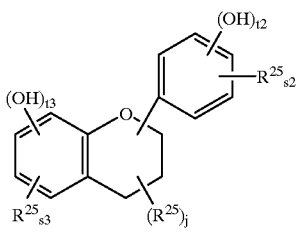

(27)
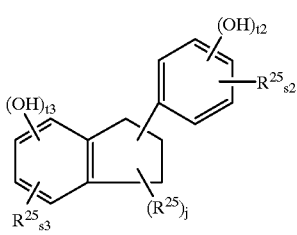

(28)
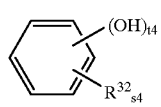

wherein
- $R^5$ is a hydrogen atom or a methyl group;
- $R^{25}$ and $R^{26}$ are each a hydrogen atom, or a straight-chain or branched alkyl or alkenyl group of 1 to 8 carbon atoms;
- $R^{27}$ is a hydrogen atom, or a straight-chain or branched alkyl or alkenyl group of 1 to 8 carbon atoms, or —$(R^{31})_h$—COOR' in which R' is a hydrogen atom or —$R^{31}$—COOH;
- $R^{28}$ is —$(CH_2)_i$— (i is an integer of 2 to 10), an arylene group of 6 to 10 carbon atoms, a carbonyl group, a sulfonyl group, an oxygen atom or a sulfur atom;
- $R^{29}$ is an alkylene group of 1 to 10 carbon atoms, an arylene group of 6 to 10 carbon atoms, a carbonyl group, a sulfonyl group, an oxygen atom or a sulfur atom;
- $R^{30}$ is a hydrogen atom, an alkyl or alkenyl group of 1 to 8 carbon atoms, or a phenyl or naphthyl group having one or more hydroxy groups;
- $R^{31}$ is a straight-chain or branched alkylene group of 1 to 10 carbon atoms;
- $R^{32}$ is a hydrogen atom, a straight-chain or branched alkyl or alkenyl group of 1 to 8 carbon atoms, or —$R^{25}$—COOH;
- j is an integer of 0 to 5, h is 0 or 1, and u is 0 or 1;
- $s_1, t_1, S_2, t_2, s_3, t_3, s_4$ and $t_4$ are numbers which satisfy the conditions represented by $s_1+t_1=8$, $S_2+t_2=5$, $S_3+t_3=4$ and $s_4+t_4=6$ and which cause each phenyl skeleton to have at least one hydroxyl group;
- β is a number which causes the compound of formula (24) to have a weight-average molecular weight of 1,000 to 5,000; and
- γ is a number which causes the compound of formula (25) to have a weight-average molecular weight of 1,000 to 10,000.

[Class II]

The compounds represented by the following general formulae (29) and (30).

(29)
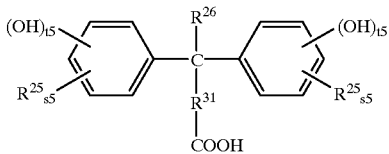

(30)
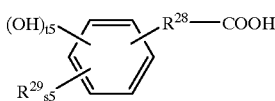

wherein $R^{25}$, $R^{26}$, $R^{31}$ and u have the same meanings as described above; and $s_5$ and $t_5$ are numbers which satisfy the conditions represented by $s_5 \geq 0$, $t_5 \geq 0$ and $s_5+t_5=5$.

Specific examples of the aforesaid component (G) include, but are not limited to, the compounds represented by the following general formulae (VIII-1) to (VIII-14) and (IX-1) to (IX-6).

(VIII-1)
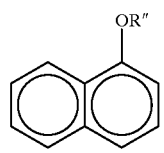

(VIII-2)
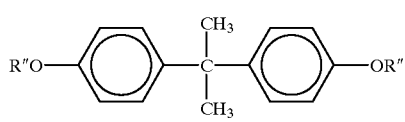

(VIII-3)
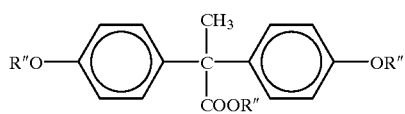

(VIII-4)
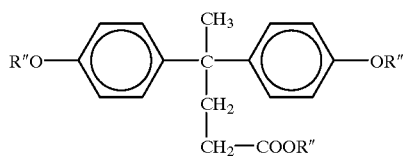

(VIII-5)
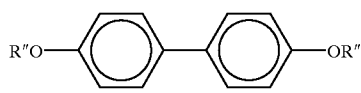

(VIII-6)
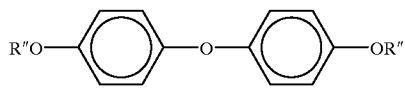

(VIII-7)
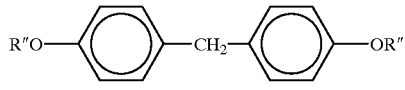

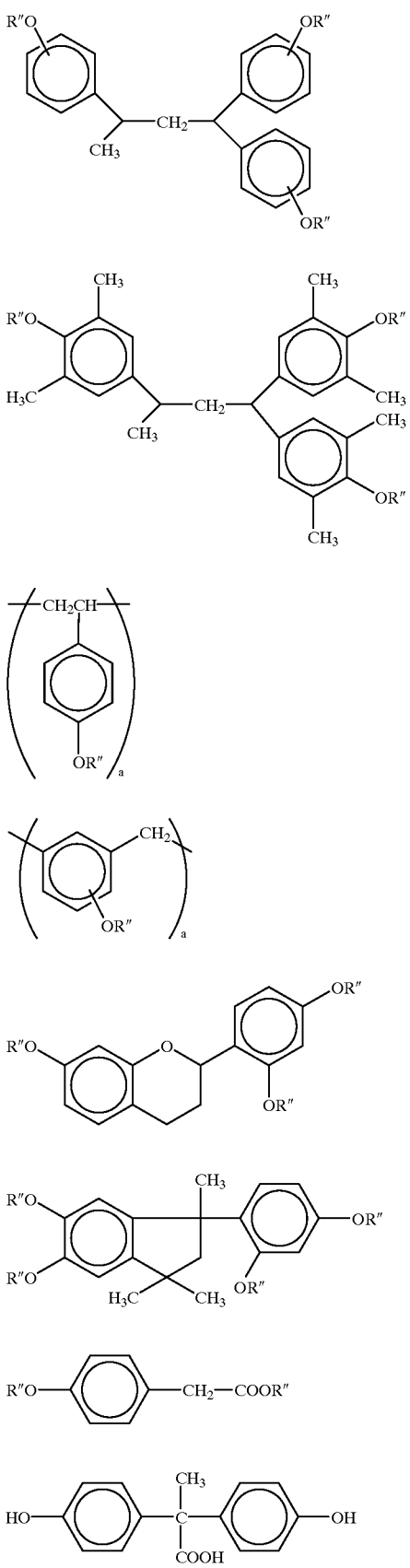

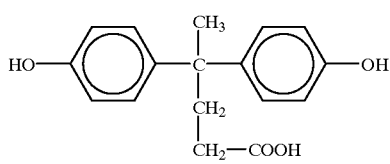

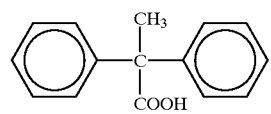

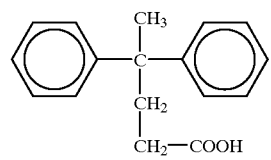

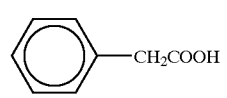

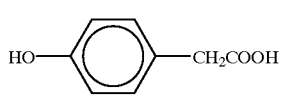

wherein R" is a hydrogen atom or CH$_2$COOH, and, in each compound, 10 to 100 mole % of the R" groups comprise CH$_2$COOH groups. α and β have the same meanings as described above.

The foregoing aromatic compounds having a group of the formula ≡C—COOH in the molecule may be used alone or in admixture of two or more.

The above-described aromatic compound having a group of the formula ≡C—COOH in the molecule is used in an amount of greater than 0 part by weight and up to 5 part by weight, preferably 0.1 to 5 parts by weight, and more preferably 1 to 3 parts by weight, per 100 parts by weight of the base resin. If it is greater than 5 parts by weight, the resulting resist material may show a reduction in resolution. However, the desired effects may be obtained even if the aforesaid aromatic compound having a group of the formula≡-C—COOH in the molecule is used in an amount of 0 part by weight per 100 parts of the base resin (i.e., it is not added at all), so that this aromatic compound is added where required.

Furthermore, the resist material of the present invention may also contain an ultraviolet absorber (H) comprising a compound having a molar extinction coefficient of not greater than 10,000 at a wavelength of 248 nm.

Specific examples thereof include condensed polycyclic hydrocarbon derivatives such as pentalene, indene, naphthalene, azulene, heptalene, biphenylene, indacene, fluorene, phenalene, phenanthrene, anthracene, fluoranthene, acephenanthrylene, aceanthrylene, triphenylene, pyrene, chrysene, naphthalene, pleiadene, picene, perylene, pentaphene, pentacene, benzophenanthrene, anthraquinone, anthrone, benzanthrone, 2,7-dimethoxynaphthalene, 2-ethyl-9,10-dimethoxyanthracene, 9,10-dimethylanthracene, 9-ethoxyanthracene, 1,2-naphthoquinone, 9-fluorene, and the compounds of the following general formulae (31) and (32); condensed heterocyclic derivatives such as thioxanthen-9-one, thianthrene and dibenzothiophene; benzophenone derivatives such as 2,3,4-trihydroxybenzophenone, 2,3,4,40-tetrahydroxybenzophenone, 2,4-dihydroxybenzophenone, 3,5-dihydroxybenzophenone, 4,4'-dihydroxybenzophenone and 4,4'-bis(dimethylamino)benzophenone; and squaric acid derivatives such as squaric acid and dimethyl squarate.

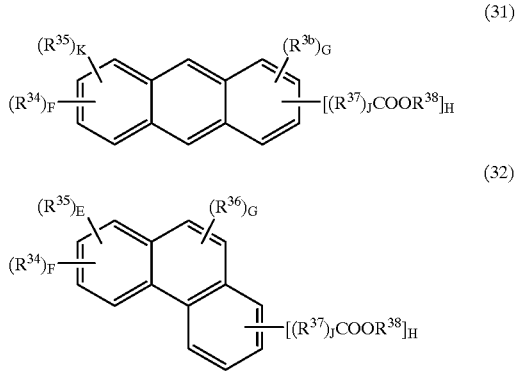

wherein
$R^{34}$ to $R^{36}$ are each independently a hydrogen atom, a straight-chain or branched alkyl group, a straight-chain or branched alkoxy group, a straight-chain or branched alkoxyalkyl group, a straight-chain or branched alkenyl group, or an aryl group;
$R^{37}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom;
$R^{38}$ is an acid-labile group; and
J is 0 or 1. E, F and G are each 0 or an integer of 1 to 9, H is a positive integer of 1 to 10, and they satisfy the condition represented by $E+F+G+H \leq 10$.

More specifically, in the above formulae (31) and (32), $R^{34}$ to $R^{36}$ are each independently a hydrogen atom, a straight-chain or branched alkyl group, a straight-chain or branched alkoxy group, a straight-chain or branched alkoxyalkyl group, a straight-chain or branched alkenyl group, or an aryl group.

Preferred examples of the straight-chain or branched alkyl group include alkyl groups of 1 to 10 carbon atoms, such as methyl, ethyl, n-propyl, isopropyl, n-butyl, sec-butyl, tert-butyl, hexyl, cyclohexyl and adamantyl. Among others, methyl, ethyl, isopropyl and tert-butyl are more preferably used.

Preferred examples of the straight-chain or branched alkoxy group include alkoxy groups of 1 to 8 carbon atoms, such as methoxy, ethoxy, propoxy, isopropoxy, n-butoxy, sec-butoxy, tert-butoxy, hexyloxy and cyclohexyloxy. Among others, methoxy, ethoxy, isopropoxy and tert-butoxy are more preferably used.

Preferred examples of the straight-chain or branched alkoxyalkyl group include alkoxyalkyl groups of 2 to 10 carbon atoms, such as methoxymethyl, 1-ethoxyethyl, 1-ethoxypropyl, 1-propoxyethyl and 1-tert-butoxyethyl. Among others, methoxymethyl, 1-ethoxyethyl, 1-ethoxypropyl and 1-propoxyethyl are more preferred.

Preferred examples of the straight-chain or branched alkenyl group include alkenyl groups of 2 to 4 carbon atoms, such as vinyl, propenyl, allyl and butenyl.

Preferred examples of the aryl group include aryl groups of 6 to 14 carbon atoms, such as phenyl, xylyl, toluyl and cumenyl.

$R^{37}$ is a substituted or unsubstituted divalent aliphatic hydrocarbon group which may contain an oxygen atom, a substituted or unsubstituted divalent alicyclic hydrocarbon group which may contain an oxygen atom, a substituted or unsubstituted divalent aromatic hydrocarbon group which may contain an oxygen atom, or an oxygen atom. In these formulae, J is 0 or 1. When J is 0, —$R^{37}$— represents a single bond.

Preferred examples of the substituted or unsubstituted divalent aliphatic hydrocarbon group which may contain an oxygen atom include groups of 1 to 10 carbon atoms, such as methylene, ethylene, n-propylene, isopropylene, n-butylene, sec-butylene, —$CH_2O$—, —$CH_2CH_2O$— and —$CH_2OCH_2$—. Among others, methylene, ethylene, —$CH_2O$— and —$CH_2CH_2O$— are more preferably used.

Preferred examples of the substituted or unsubstituted divalent alicyclic hydrocarbon group which may contain an oxygen atom include groups of 5 to 10 carbon atoms, such as 1,4-cyclohexylene, 2-oxacyclohexan-1,4-ylene and 2-thiacyclohexan-1,4-ylene.

Preferred examples of the substituted or unsubstituted divalent aromatic hydrocarbon group which may contain an oxygen atom include arylene groups of 6 to 14 carbon atoms, such as o-phenylene, p-phenylene, 1,2-xylene-3,6-ylene, toluen-2,5-ylene and 1-cumen-2,5-ylene; and arylalkylene groups of 6 to 14 carbon atoms, such as —$CH_2Ph$—, —$CH_2PhCH_2$—, —$OCH_2Ph$— and —$OCH_2PhCH_2O$— (in which Ph is a phenyl group).

$R^{38}$ is an acid-labile group. No particular limitation is placed on the group represented by $R^{37}$, provided that it is decomposed to in the presence of an acid to liberate a functional group or groups having solubility in alkali. However, the groups represented by the following general formulae (33a), (33b) and (33c) are especially preferred.

wherein $R^3$, $R^{40}$, $R^{51}$ and $R^{52}$ are each independently a hydrogen atom, a straight-chain or branched alkyl group, a straight-chain or branched alkoxy group, a straight-chain or branched alkoxyalkyl group, a straight-chain or branched alkenyl group, or an aryl group, provided that these groups may contain a carbonyl group in the chain, and all of $R^{39}$, $R^{40}$, $R^{51}$ and $R^{52}$ should not be hydrogen atoms. $R^{39}$ and $R^{40}$ may be combined with each other to form a ring.

$R^{52}$ is a straight-chain or branched alkyl group, a straight-chain or branched alkoxyalkyl group, a straight-chain or branched alkenyl group, or an aryl group, provided that these groups may contain a carbonyl group in the chain. $R^{52}$ may be combined with $R^{39}$ to form a ring.

In this case, specific examples of the aforesaid straight-chain or branched alkyl group, straight-chain or branched alkoxy group, straight-chain or branched alkoxyalkyl group, straight-chain or branched alkenyl group, and aryl group are the same as described above for $R^{34}$ to $R^{36}$.

In formula (33a), specific examples of the ring formed by combining $R^{39}$ and $R^{40}$ with each other include groups of 4 to 10 carbon atoms, such as cyclohexylidene, cyclopentylidene, 3-oxocyclohexylidene, 3-oxo-4-oxacyclohexylidene and 4-methylcyclohexylidene.

Moreover, in formula (33b), specific examples of the ring formed by combining $R^{39}$ and $R^{40}$ with each other include groups of 3 to 9 carbon atoms, such as 1-silacyclohexylidene, 1-silacyclopentylidene, 3-oxo-1-silacyclopentylidene and 4-methyl-1-silacyclopentylidene.

Furthermore, in formula (33c), specific examples of the ring formed by combining $R^{52}$ and $R^{39}$ with each other include groups of 4 to 10 carbon atoms, such as 2-oxacyclohexylidene, 2-oxacyclopentylidene and 2-oxa-4-methylcyclohexylidene.

Preferred examples of the group represented by the above formula (33a) include tertiary alkyl groups of 4 to 10 carbon atoms, such as tert-amyl, tert-butyl, 1,1-dimethylbutyl, 1-ethyl-1-methylpropyl and 1,1-diethylpropyl; and 3-oxoalkyl groups such as 1,1-dimethyl-3-oxobutyl, 3-oxocyclohexyl and 1-methyl-3-oxo-4-oxacyclohexyl.

Preferred examples of the group represented by the above formula (33b) include trialkylsilyl groups of 3 to 10 carbon atoms, such as trimethylsilyl, ethyldimethylsilyl, dimethylpropylsilyl, diethylmethylsilyl and triethylsilyl.

Preferred examples of the group represented by the above formula (33c) include groups of 2 to 8 carbon atoms, such as 1-methoxymethyl, 1-methoxyethyl, 1-ethoxyethyl, 1-ethoxypropyl, 1-ethoxyisobutyl, 1-n-propoxyethyl, 1-tert-butoxyethyl, 1-n-butoxyethyl, 1-isobutoxyethyl, 1-tert-pentoxyethyl, 1-cyclohexyloxyethyl, 1-(2-n-butoxyethoxy)ethyl, 1-(2-ethylhexyloxy)ethyl, 1-{4-(acetoxymethyl)cyclohexylmethyloxy}ethyl, 1-{4-(tert-butoxycarbonyloxymethyl)cyclohexylmethyloxy}ethyl, 1-methoxy-1-methylethyl, 1-ethoxypropyl, dimethoxymethyl, diethoxymethyl, 2-tetrahydrofuranyl and 2-tetrahydropyranyl.

In the above formulae (31) and (32), E, F and G are each 0 or a positive integer of 1 to 9, H is a positive integer of 1 to 10, and they satisfy the condition represented by $E+F+G+H \leq 10$.

Preferred specific examples of the compounds represented by the above formulae (31) and (32) include the compounds of the following formulae (34a) to (34j).

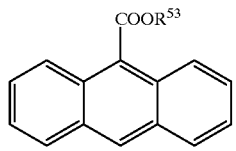
(34a)

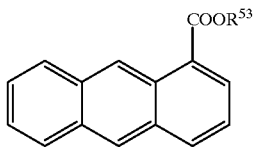
(34b)

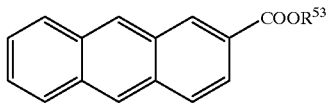
(34c)

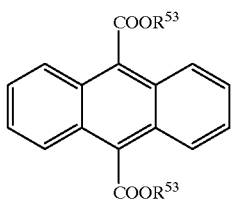
(34d)

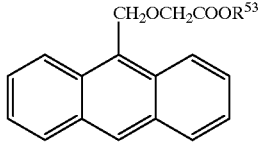
(34e)

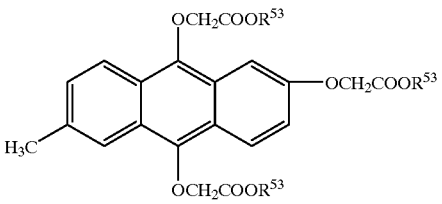
(34f)

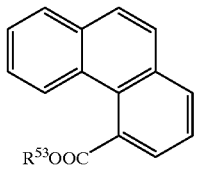
(34g)

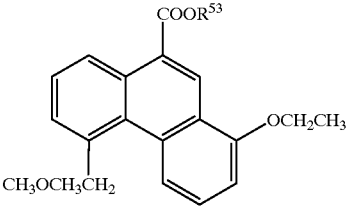
(34h)

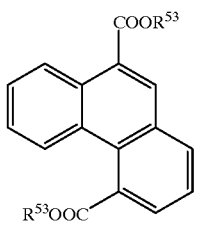
(34i)

-continued

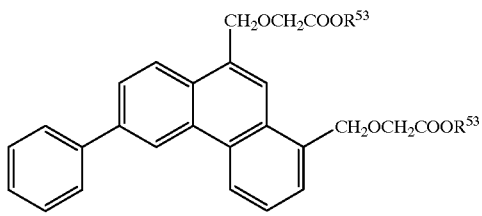

(34j)

wherein $R^{53}$ is an acid-labile group.

Other usable ultraviolet absorbers include diaryl sulfoxide derivatives such as bis(4-hydroxyphenyl) sulfoxide, bis(4-tert-butoxyphenyl) sulfoxide, bis(4-tert-butoxycarbonyloxyphenyl) sulfoxide and bis[4-(1-ethoxyethoxy)phenyl] sulfoxide; diaryl sulfone derivatives such as bis(4-hydroxyphenyl) sulfone, bis(4-tert-butoxyphenyl) sulfone, bis(4-tert-butoxycarbonyloxyphenyl) sulfone, bis[4-(1-ethoxyethoxy)phenyl] sulfone and bis[4-(1-ethoxypropoxy)phenyl] sulfone; diazo compounds such as benzoquinone diazide, naphthoquinone diazide, anthraquinone diazide, diazofluorene, diazotetralone and diazophenathrone; and quinonediazido-containing compounds such as completely or partially esterified compounds derived from naphthoquinone-1,2-diazido-5-sulfonic acid chloride and 2,3,4-trihydroxybenzophenone, and completely or partially esterified compounds derived from naphthoquinone-1,2-diazido-4-sulfonic acid chloride and 2,4,4'-trihydroxybenzophenone.

Preferred examples of ultraviolet absorbers tert-butyl 9-anthracenecarboxylate, tert-amyl 9-anthracenecarboxylate, tert-methoxymethyl 9-anthracenecarboxylate, tert-ethoxyethyl 9-anthracenecarboxylate, 2-tert-tetrahydropyranyl 9-anthracenecarboxylate, 2-tert-tetrahydrofuranyl 9-anthracenecarboxylate, and partially esterified compounds derived from naphthoquinone-1,2-diazido-5-sulfonic acid chloride and 2,3,4-trihydroxybenzophenone.

The above-described ultraviolet absorber constituting component (H) is preferably used in an amount of 0 to 10 parts by weight, more preferably 0.5 to 10 parts by weight, and most preferably 1 to 5 parts by weight, per 100 parts by weight.

The resist material of the present invention may further contain one or more acetylene alcohol derivatives as a component (I), which can enhance a storage stability.

One or more compounds represented by the general formula (35) or (36) may be preferably used as the acetylene derivative.

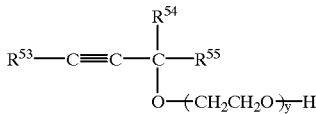

(35)

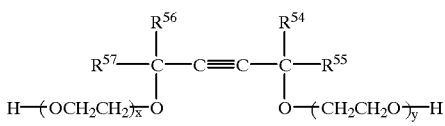

(36)

wherein $R^{53}$, $R^{54}$, $R^{55}$, $R^{56}$ and $R^{57}$ are each a hydrogen atom or a straight-chain, branched or cyclic alkyl group of 1 to 8 carbon atoms; X and Y are each 0 or a positive integer and they satisfy the condition represented by $0 \leq X \leq 30$, $0 \leq Y \leq 30$ and $0 \leq X+Y \leq 40$.

Preferable examples of the acetylene alcohol derivatives include Surfinol 61, Surfinol 82, Surfinol 104, Surfinol 104A, Surfinol 104H, Surfinol 104A, Surfinol TG, Surfinol PC, Surfinol 440, Surfinol 465 and Surfinol 485 manufactured by Air Products and Chemicals Inc.; and Surfinol E1004 manufactured by Nisshin Kagaku Kogyo.

The above-described acetylene alcohol derivative is preferably used in an amount of 0.02 to 2% by weight, and more preferably 0.02 to 1% by weight, in a 100% by weight resist composition. If it is less than 0.01% by weight, improvement for coating properties and storage stability may not be sufficiently obtained. If it is more than 2% by weight, the resolution for the resist material may be lowered.

In addition to the above-described ingredients, the resist material of the present invention may contain, as an optional ingredient, a surface-active agent commonly used to improve coating properties. This optional ingredient may be added in a commonly used amount, provided that the effects of the present invention are not interfered with.

Preferred examples of the surface-active agents are non-ionic surface-active agents such as perfluoroalkyl polyoxyethylene ethanol, fluorinated alkyl esters, perfluoroalkylamine oxides and fluorine-containing organosiloxane compounds. Specific examples thereof include Florad "FC-430" and "FC-431" (both manufactured by Sumitomo 3M Ltd.); Surflon "S-141" and "S-145" (both manufactured by Asahi Glass Co., Ltd.); Unidain "DS-401", "DS-403" and "DS-451" (all manufactured by Daikin Industries, Ltd.); Megafac "F-8151" (manufactured by Dainippon Ink & Chemicals, Inc.); and "X-70-092" and "X-70-093" (both manufactured by Shin-etsu Chemical Co., Ltd.). Among them, Florad "FC-430" (manufactured by Sumitomo 3M Ltd.) and "X-70-093" (manufactured by Shin-etsu Chemical Co., Ltd.) are preferred.

The present invention provides a process for pattern formation using an above chemically amplified positive material.

In order to form patterns by using a chemically amplified positive type resist materials in accordance with the present invention, any well-known lithographic technique may be employed. For example, according to a spin coating technique or the like, the resist material is applied onto a silicone wafer to a thickness of 0.5–2.0 μm and prebaked on a hot plate at 60 to 150° C. for 1 to 10 minutes, preferably 80–120° C. for 1 to 5 minutes. Thereafter, the obtained film of the resist material, above which a mask for the targeted pattern formation is placed, is exposed in an approximate amount of 1 to 200 mJ/cm², preferably 10 to 100 mJ/cm², to high-energy radiation such as far ultraviolet radiation having a frequency of 300nm or less, excimer laser and X-rays, or electron beam. Then it is subjected to a post-exposure bake (PEB) on a hot plate at 60–150° C. for 1 to 5 minutes, preferably 80–120° C. for 1 to 3 minutes, and then developed for 0.1 to 3 minutes, preferably 0.5 to 2 minutes in a developing solution of aqueous alkaline such as 0.1 to 5% by weight, preferably 2 to 3% by weight tetramethylammonium hydroxide (TMAH), using a ordinary method such as dip, puddle, spray or the like. As a result, the targeted pattern on the substrate is formed.

Among various types of high-energy radiation, the resist materials of the present invention are most suitable for fine patterning with far ultraviolet radiation at 254–193 nm or excimer laser, X-rays or electron rays. If radiation frequency is out of the suitable range, the targeted pattern may not be obtained.

The present invention is further illustrated by the following synthesis examples, examples and comparative examples. However, these examples are not to be construed to limit the scope of the invention.

SYNTHESIS EXAMPLE 1

100 g of polyhydroxystyrene (having a weight-average molecular weight of 11,000 and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 43.1 g of 2-vinyloxyethyl tert-butylcarbonate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 22.0 mole % of the hydrogen atoms of the hydroxyl groups present in the polyhydroxystyrene were replaced by 1-(2-tert-butoxycarbonyloxyethoxy)ethyl groups (Polym. 1).

SYNTHESIS EXAMPLE 2

100 g of a hydroxystyrene-methacrylic acid copolymer (having a copolymerization ratio of 80:20, a weight-average molecular weight of 11,000, and a molecular weight distribution of 1.20) was dissolved in 400 g of a solvent mixture composed of ethyl acetate and tetrahydrofuran (in a mixing ratio of 9:1). After the addition of 4 g of methanesulfonic acid, 62 g of 4-vinyloxybutyl tert-butylcarbonate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 26.0 mole % of the hydrogen atoms of the phenolic hydroxyl groups and carboxy groups present in the hydroxystyrene-methacrylic acid copolymer were replaced by 1-(4-tert-butoxycarbonyloxybutoxy)-ethyl groups (Polym. 2).

SYNTHESIS EXAMPLE 3

100 g of polyhydroxystyrene (having a weight-average molecular weight of 11,000 and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 62.3 g of 3-(1-propenyloxy)-1,2-propanediol di(tert-butylcarbonate) was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 18.0 mole % of the hydrogen atoms of the hydroxyl groups present in the polyhydroxystyrene were replaced by 1-(2,3-di-tert-butoxycarbonyloxypropoxy)propyl groups (Polym. 3).

SYNTHESIS EXAMPLE 4

100 g of polyhydroxystyrene (having a weight-average molecular weight of 11,000 and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 39.4 g of 2-vinyloxyethyl pivalate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 22.0 mole % of the hydrogen atoms of the hydroxyl groups present in the polyhydroxystyrene were replaced by 1-(2-pivaloyloxyethoxy)ethyl groups (Polym. 4).

SYNTHESIS EXAMPLE 5

100 g of polyhydroxystyrene (having a weight-average molecular weight of 11,000 and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 56.3 g of 3-(1-propenyloxy)-1,2-propanediol dipivalate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 18.0 mole % of the hydrogen atoms of the hydroxyl groups present in the polyhydroxystyrene were replaced by 1-(2,3-dipivaloyloxypropoxy)propyl groups (Polym. 5).

SYNTHESIS EXAMPLE 6

100 g of polyhydroxystyrene (having a weight-average molecular weight of 11,000 and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 45.0 g of 3-(1-propenyloxy)-1,2-propanediol diacetate and then 10.63 g of 1,4-butanediol dipropenyl ether were added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer of the average-molecular-weight of 23,000 (polym. 6) in which 20.0 mole % of the hydrogen atoms of the hydroxyl groups present in the polyhydroxystyrene were replaced by 1-(2,3-diacetoxypropoxy)propyl groups, and 6.0 mole % of the hydroxy groups present in the polyhydroxystyrene forms ether with alcoholic hydroxide of 1,4-butanediol di(1-hydroxypropyl) ether, yielding a crosslinkage.

SYNTHESIS EXAMPLE 7

100 g of a hydroxystyrene-methacrylic acid copolymer (having a copolymerization ratio of 80:20, a weight-average molecular weight of 11,000, and a molecular weight distribution of 1.20) was dissolved in 400 g of a solvent mixture composed of ethyl acetate and tetrahydrofuran (in a mixing ratio of 9:1). After the addition of 4 g of methanesulfonic acid, 31 g of 3-(1-propenyloxy)-1,2-propanediol diacetate and then 13.3 g of 1-ethoxypropene were added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 13.0 mole % and 14.0 mole % of the hydrogen atoms of the phenolic hydroxyl groups and carboxy groups present in the polyhydroxystyrene were replaced by 1-(2,3-diacetoxypropoxy)propyl groups and 1-ethoxypropyl groups, respectively (Polym. 7).

SYNTHESIS EXAMPLE 8

100 g of partially hydrogenated polyhydroxystyrene (having a degree of hydrogenation of 20%, a weight-average molecular weight of 11,000, and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 42.7 g of 2-vinyloxyethyl tert-butylcarbonate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 22.0 mole % of the hydrogen atoms of the hydroxyl groups present in the partially hydrogenated polyhydroxystyrene were replaced by 1-(2-tert-butoxycarbonyloxyethoxy)ethyl groups (Polym. 8).

SYNTHESIS EXAMPLE 9

100 g of partially hydrogenated polyhydroxystyrene (having a degree of hydrogenation of 20%, a weight-average molecular weight of 11,000, and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 55.7 g of 3-(1-propenyloxy)-1,2-propanediol dipivalate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 18.0 mole % of the hydrogen atoms of the hydroxyl groups present in the partially hydrogenated polyhydroxystyrene were replaced by 1-(2,3-dipivaloyloxypropoxy)propyl groups (Polym. 9).

SYNTHESIS EXAMPLE 10

100 g of partially hydrogenated polyhydroxystyrene (having a degree of hydrogenation of 20%, a weight-average molecular weight of 11,000, and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 29 g of 3-(1-propenyloxy)-1,2-propanediol diacetate was added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours.

The powdery solid thus obtained was dissolved in 300 g of pyridine. After the addition of 13.8 g of chlorotrimethylsilane, the resulting mixture was stirred at room temperature for 6 hours. This reaction mixture concentrated under reduced pressure. The resulting residue was mixed with 400 g of ethyl acetate and 100 g of water, and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 13.0 mole % and 14.0 mole % of the hydrogen atoms of the hydroxyl groups present in the partially hydrogenated polyhydroxystyrene were replaced by 1-(2,3-diacetoxypropoxy) propyl groups and trimethylsilyl groups, respectively (Polym. 10).

SYNTHESIS EXAMPLE 11

100 g of partially hydrogenated polyhydroxystyrene (having a degree of hydrogenation of 20%, a weight-average molecular weight of 11,000, and a molecular weight distribution of 1.05) was dissolved in 400 g of a solvent mixture composed of ethyl acetate and tetrahydrofuran (in a mixing ratio of 9:1). After the addition of 4 g of methanesulfonic acid, 29 g of 3-(1-propenyloxy)-1,2-propanediol diacetate and then 10.4 g of 3,4-dihydro-2H-pyran were added thereto at 30° C. or below with stirring. After the resulting mixture was allowed to react at room temperature for 30 minutes, 13.2 g of pyridine was added thereto and the stirring was continued for an additional hour. This reaction mixture was mixed with 100 g of water and subjected to a separation process. The organic layer was washed twice with 100 g portions of water and concentrated under reduced pressure. The resulting residue was dissolved in 300 g of methanol, and this solution was added dropwise to 20 liters of water, so that a powdery solid was obtained. This powdery solid was collected by filtration, further washed with 20 liters of water, and vacuum-dried at 40° C. for 24 hours. As a result of $^1$H-NMR analysis, it was confirmed that this product was a polymer in which 13.0 mole % and 12.0 mole % of the hydrogen atoms of the hydroxyl groups present in the partially hydrogenated polyhydroxystyrene were replaced by 1-(2,3-diacetoxypropoxy)propyl groups and 2-tetrahydropyranyl groups, respectively (Polym. 11).

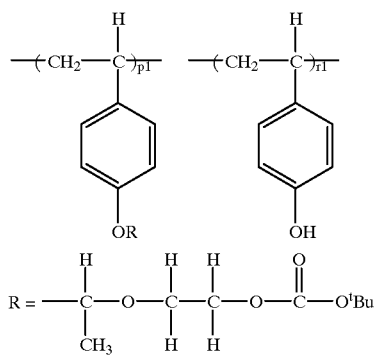

Polym.1

-continued

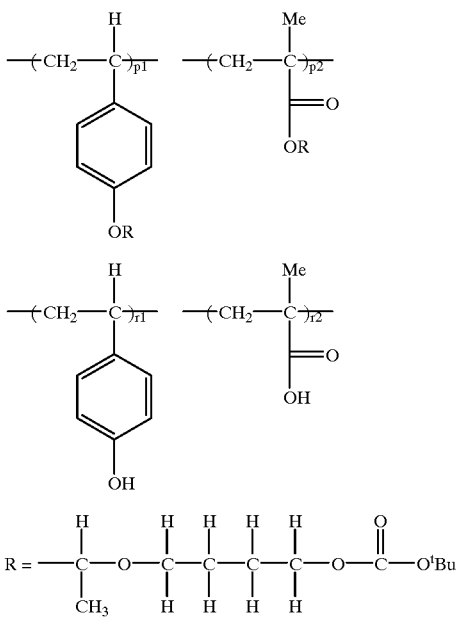

Polym.2

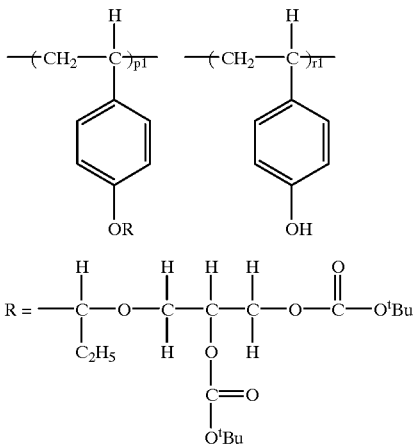

Polym.3

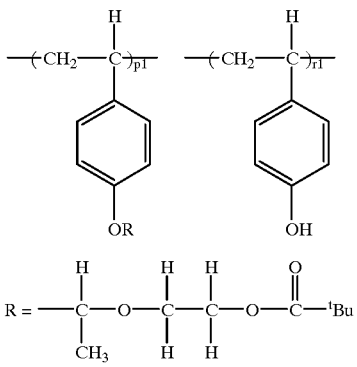

Polym.4

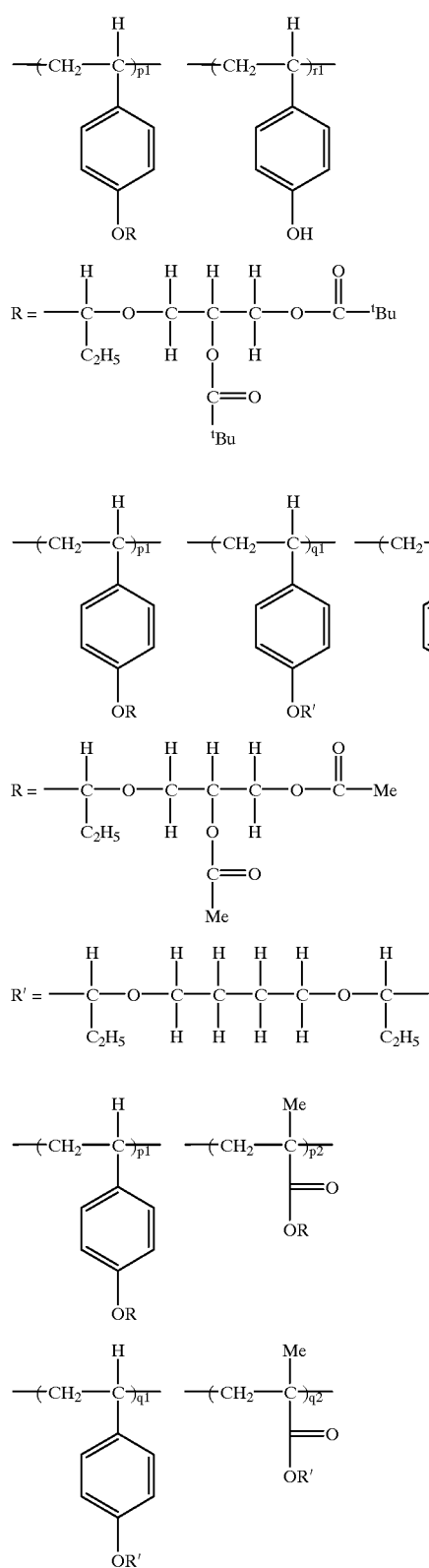
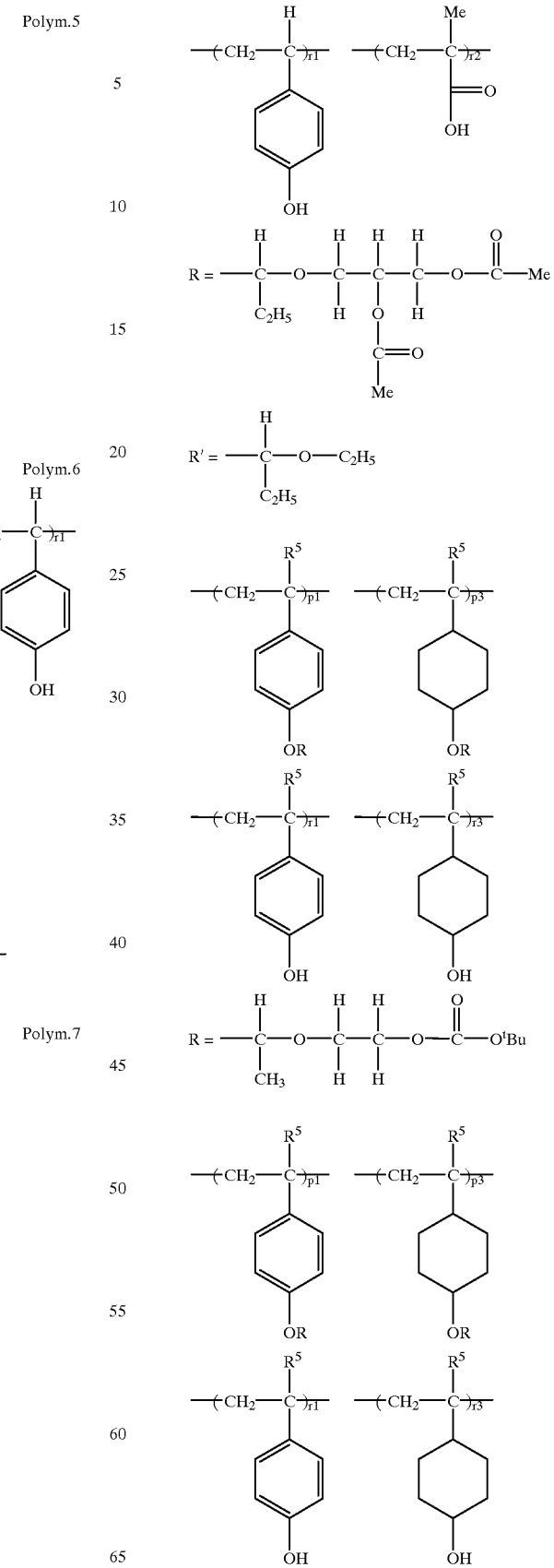

-continued

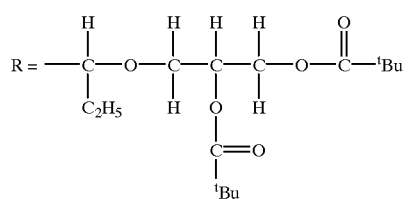

Polym.10

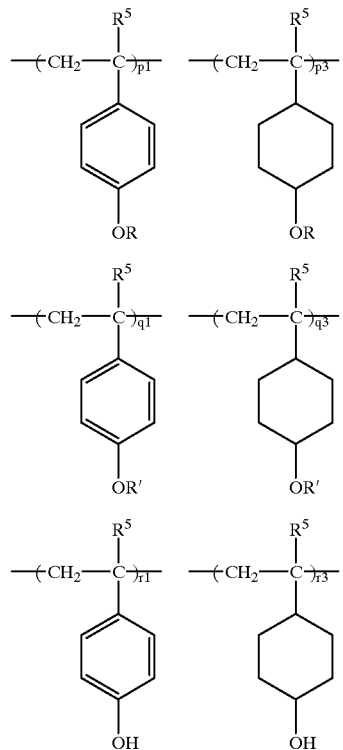

Polym.11

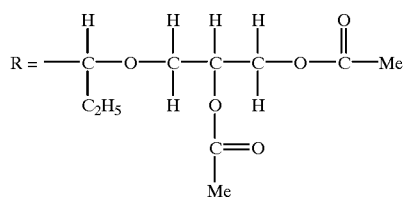

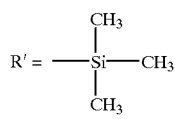

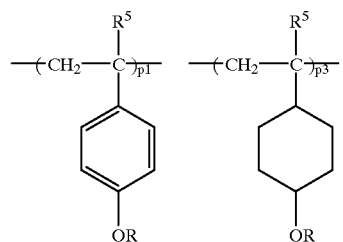

-continued

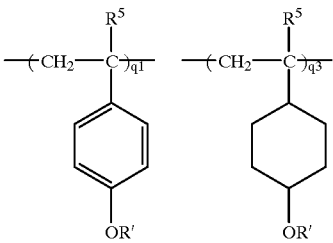

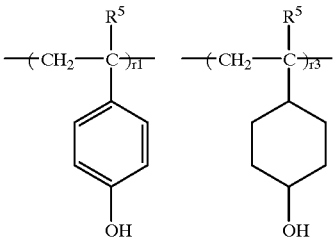

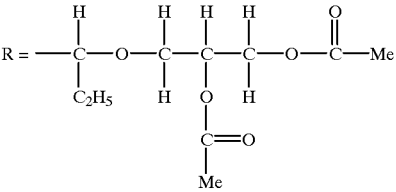

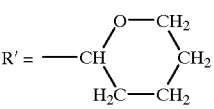

EXAMPLES AND COMPARATIVE EXAMPLES

According to the formulations shown in Table 2, resist compositions were prepared by dissolving selected resist material components in a solvent. The resist material components used for this purpose include base resins comprising the polymeric compounds (Polym. 1-11) obtained in the foregoing Synthesis Examples, acid generators represented by the following formulae (PAG. 1-12), dissolution inhibitors represented by the following formulae (DRR. 1-4), basic compounds, aromatic compounds having a group of the formula ≡C—COOH in the molecule as represented by the following formulae (ACC. 1-2), and ultraviolet absorbers represented by the following formulae (DYE. 1-2). If necessary, 0.1 part by weight of a surface-active agent (Florad "FC-430"; manufactured by Sumitomo 3M Ltd.) was added to improve film-forming properties.

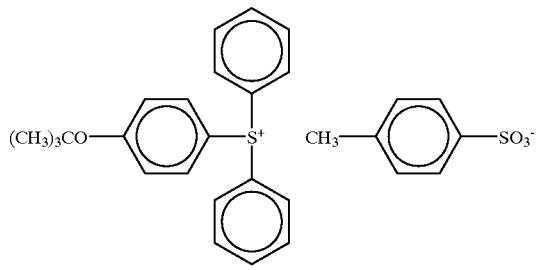 (PAG.1)
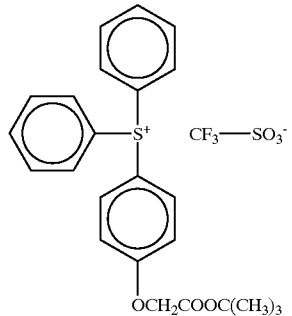 (PAG.2)
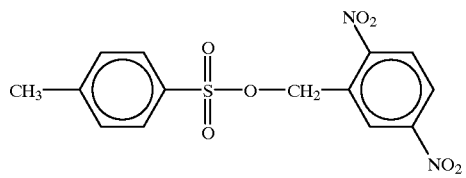 (PAG.3)
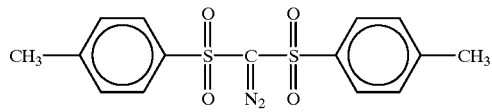 (PAG.4)
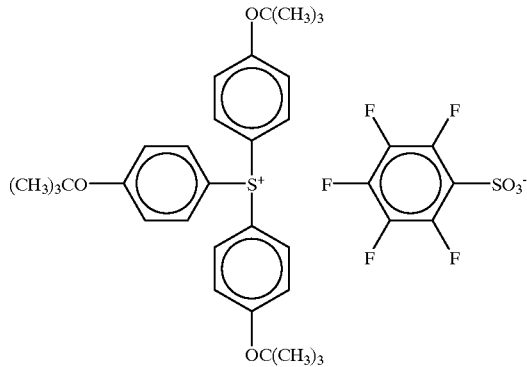 (PAG.5)
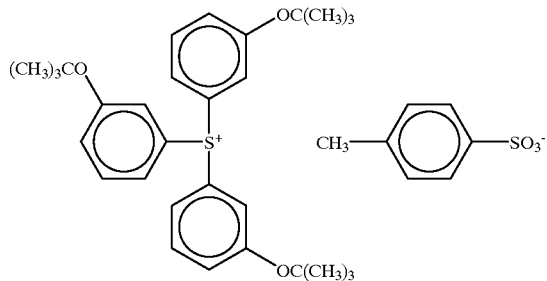 (PAG.6)

(PAG.7)
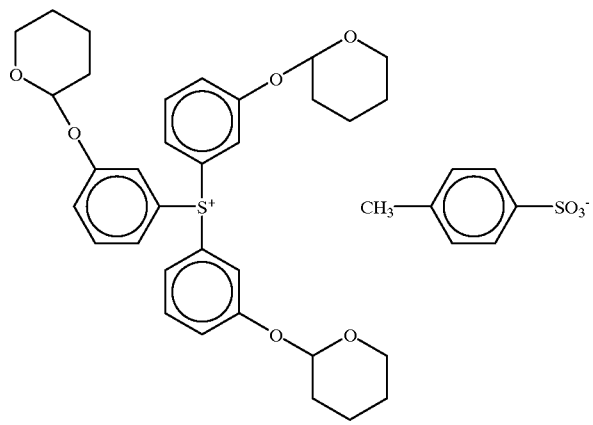
(PAG.8)
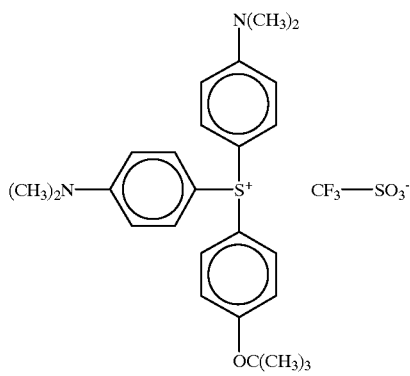
(PAG.9)
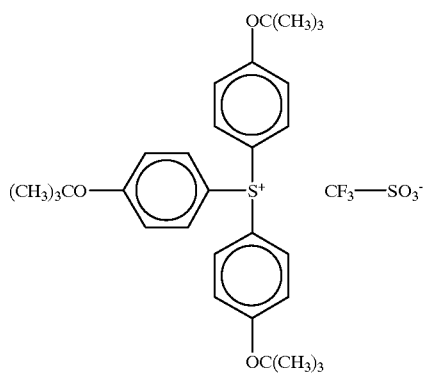
(PAG.10)
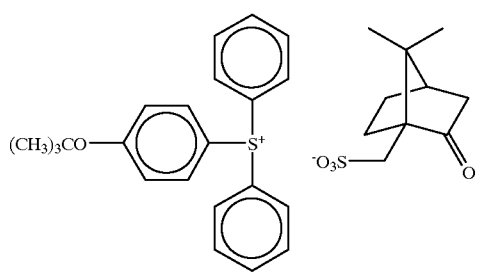
(PAG.11)
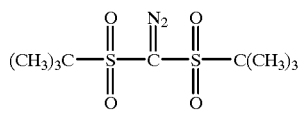

-continued
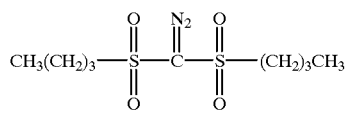 (PAG.12)
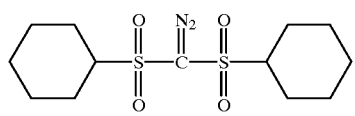 (PAG.13)
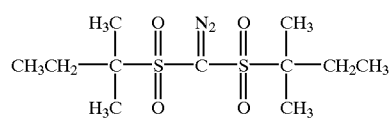 (PAG.14)
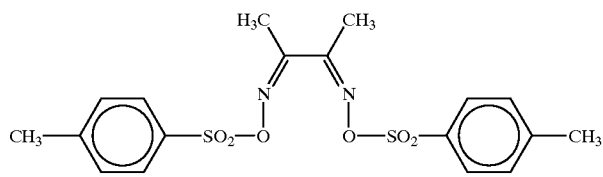 (PAG.15)
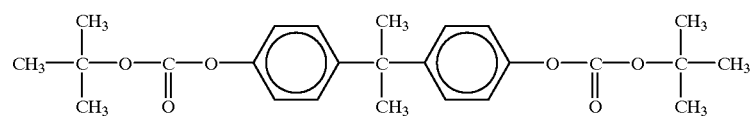 (DRR.1)
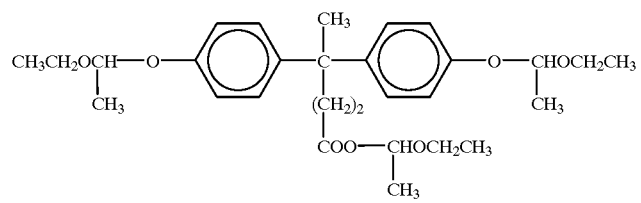 (DRR.2)
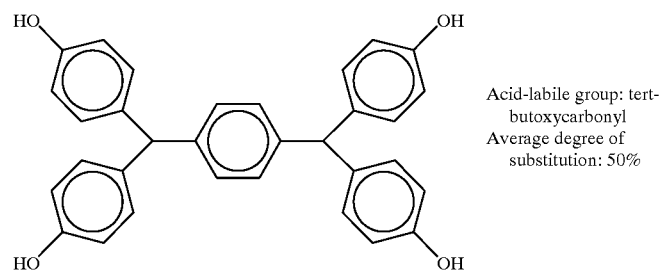 (DRR.3)
Acid-labile group: tert-butoxycarbonyl
Average degree of substitution: 50%
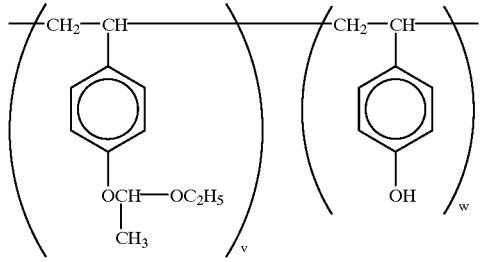 (DRR.4)
$v/(v+w) = 0.09$
Weight-average molecular weight: 3,000

-continued
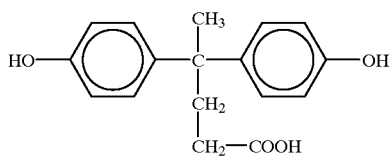
ACC.1
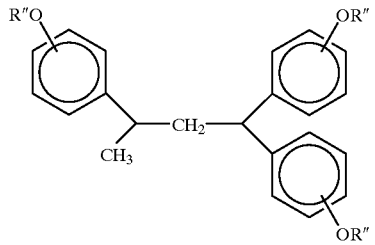
$$\left( \begin{array}{c} R'' = H \text{ or } CH_2COOH \\ \dfrac{[CH_2COOH]}{[H] + [CH_2COOH]} = 0.5 \end{array} \right)$$
ACC.2
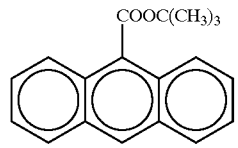
DYE.1
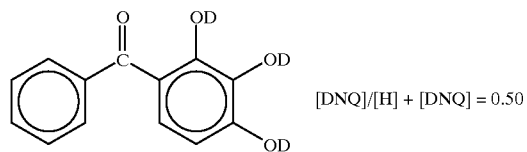
[DNQ]/[H] + [DNQ] = 0.50
DYE.2
D = H or 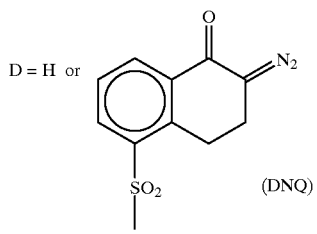 (DNQ)
TABLE 1
| Synthesis Example | Molar proportion | | | | | | Starting material |
|---|---|---|---|---|---|---|---|
| | $p_1 + p_2$ | $p_1 + p_3$ | $q_1 + q_2$ | $q_1 + q_3$ | $r_1 + r_2$ | $r_1 + r_3$ | |
| Polym. 1 | 0.22 | — | 0.00 | — | 0.78 | — | ① |
| Polym. 2 | 0.26 | — | 0.00 | — | 0.74 | — | ② |
| Polym. 3 | 0.18 | — | 0.00 | — | 0.82 | — | ① |
| Polym. 4 | 0.22 | — | 0.00 | — | 0.78 | — | ① |
| Polym. 5 | 0.18 | — | 0.00 | — | 0.82 | — | ① |
| Polym. 6 | 0.20 | — | 0.06 | — | 0.74 | — | ① |
| Polym. 7 | 0.13 | — | 0.14 | — | 0.73 | — | ② |
| Polym. 8 | — | 0.22 | — | 0.00 | — | 0.78 | ③ |
| Polym. 9 | — | 0.18 | — | 0.00 | — | 0.82 | ③ |
| Polym. 10 | — | 0.13 | — | 0.14 | — | 0.73 | ③ |
| Polym. 11 | — | 0.13 | — | 0.12 | — | 0.75 | ③ |
| Polym. 12 | 0.35 | — | 0.00 | — | 0.65 | — | ① |

TABLE 1-continued

| Synthesis Example | Molar proportion | | | | | | Starting material |
|---|---|---|---|---|---|---|---|
| | $p_1 + p_2$ | $p_1 + p_3$ | $q_1 + q_2$ | $q_1 + q_3$ | $r_1 + r_2$ | $r_1 + r_3$ | |
| Polym. 13 | 0.20 | — | 0.00 | — | 0.80 | — | ① |
| Polym. 14 | 0.24 | — | 0.08 | — | 0.68 | — | ① |

Starting material ① : Polyhydroxystyrene (having a weight-average molecular weight of 11,000 and a molecular weight distribution of 1.05).

Starting material ② : Hydroxystyrene-methacrylic acid copolymer (having a copolymerization ratio of 80:20, a weight-average molecular weight of 11,000, and a molecular weight distribution of 1.20).

Starting material ③ : Partially hydrogenated polyhydroxy-styrene (having a degree of hydrogenation of 20%, a weight-average molecular weight of 11,000 and a molecular weight distribution of 1.05).

Moreover, for purposes of comparison, resist compositions were prepared in the same manner as described above, except that polymeric compounds represented by the following rational formulae (Polym. 12-14) were used as base resins.

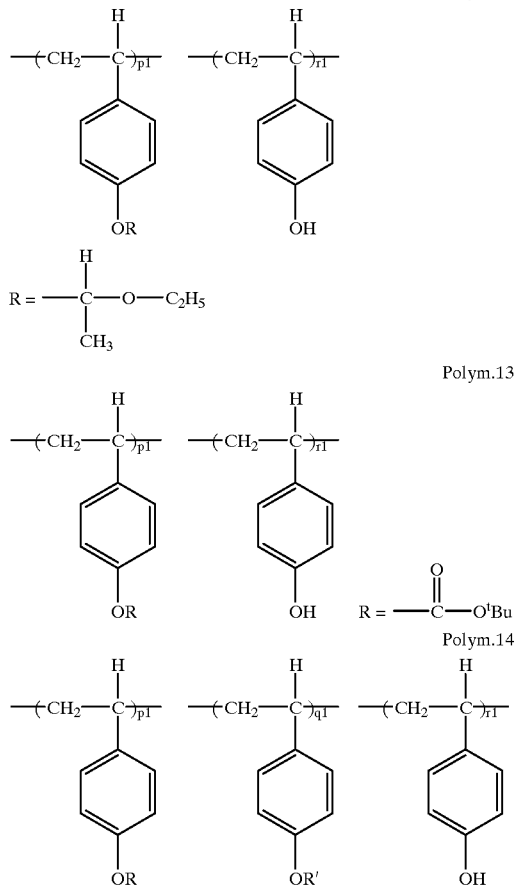

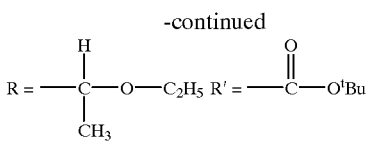

Each of these compositions was filtered through a 0.1 µm Teflon filter to obtain a resist fluid. According to a spin coating technique, this resist fluid was applied onto a wafer to a thickness of 0.7 µm. Then, this wafer was baked on a hot plate at 100° C. for 90 seconds.

Subsequently, this wafer was exposed to light by means of an excimer laser stepper (NSR-2005EX; manufactured by Nikon Corp.; NA=0.5), baked at 110° C. for 90 seconds, and developed with a 2.38% aqueous solution of tetramethylammonium hydroxide to form a positive pattern.

The resist pattern thus obtained was evaluated in the following manner.

First of all, its sensitivity ($E_{th}$) was determined. Next, assuming that the exposure at which the tops and bottoms of 0.24 µm lines and spaces were resolved at a ratio of 1:1 was the optimum exposure ($E_{op}$), the minimum line width of the lines and spaces which were found to separate at this exposure was regarded as the resolution of the resist being evaluated. Moreover, its resolution was also examined by exposing the wafer to light at the same exposure and baking it after a period (PED) of 2 hours. The shape of the developed resist pattern was observed with a scanning electron microscope. As a test for thermal resistance, this resist pattern was heated on a hot plate at 130° C. for 10 minutes and examined for changes in shape after heating.

The formulations of the resist compositions are shown in Table 2 and the results of evaluation of the Examples and Comparative Examples are shown in Table 3.

TABLE 2

Resist material composition [formulation (parts by weight)]

| No. | Base resin | Photo-acid generator | Dissolution inhibitor | Basic compound | Other additives | Organic solvent |
|---|---|---|---|---|---|---|
| 1 | Polym. 1 (80) | PAG. 1 (3) | | | | PGMEA(530) |
| 2 | Polym. 1 (80) | PAG. 7 (1) PAG. 9 (2) | DRR. 2 (8) | NMP (0.1) | | EL/BA(510) |
| 3 | Polym. 3 (80) | PAG. 1 (1) PAG. 11 (2) | | TEA (0.1) DE (0.05) | ACC.1 (0.2) | PGMEA(530) |
| 4 | Polym. 4 (80) | PAG. 1 (1) PAG. 8 (2) | DRR. 3 (16) | QN (0.06) | | PGMEA/EL(580) |
| 5 | Polym 5 (80) | PAG. 7 (1) PAG. 9 (2) | DRR. 2 (8) | NMP (0.1) | | EL/BA(510) |
| 6 | Polym. 6 (80) | PAG. 7 (1) PAG. 9 (2) | DRR. 2 (8) | NMP (0.1) | | EL/BA(510) |
| 7 | Polym. 2 (80) | PAG. 2 (3) | DRR. 1 (8) | | | PGMEA(530) |
| 8 | Polym. 2 (80) | PAG. 2 (3) | DRR. 1 (8) | | | PGMEA(530) |
| 9 | Polym. 7 (80) | PAG. 2 (3) | DRR. 1 (8) | | | PGMEA(530) |
| 10 | Polym. 7 (80) | PAG. 8 (3) | DRR. 1 (8) | TMEDA (0.1) | | PGMEA(530) |
| 11 | Polym. 8 (80) | PAG. 8 (3) | | | | PGMEA(530) |
| 12 | Polym. 9 (80) | PAG. 1 (1) PAG. 12(2) | | TEA (0.1) DBU (0.1) | ACC.1 (0.5) | PGMEA(530) |
| 13 | Polym. 10 (80) | PAG. 8 (3) | | | | PGMEA(530) |
| 14 | Polym. 11 (80) | PAG. 8 (3) | | | | PGMEA(530) |
| 15 | Polym. 1 (80) | PAG. 5 (3) | | TEA (0.1) | ACC.2 (0.2) | PGMEA(530) |
| 16 | Polym. 1 (50) Polym. 2 (30) | PAG. 1 (4) | DMA (5.0) | TEA (0.03) | | PGMEA(530) |
| 17 | Polym. 1 (50) Polym. 2 (30) | PAG. 10 (4) | DRR. 2 (4) | HP (0.11) | ACC.2 (2) | PGMEA(530) |
| 18 | Polym. 2 (80) | PAG. 1 (1) PAG. 12 (2) | | TMMEA (0.05) | DYE1. (1.2) | PGMEA(530) |
| 19 | Polym. 4 (80) | PAG. 1 (1) PAG.13 (2) | | TMEEA (0.05) | DYE.2 (4) | PGMEA(530) |
| 20 | Polym. 5 (80) | PAG.1 (1) PAG.14 (2) | | TMEMEA (0.05) | DYE.1 (1.2) ACC.1 (0.2) | PGMEA(530) |
| 21 | Polym. 8 (80) | PAG.1 (1) PAG.15 (2) | | TMEMEA (0.05) | DYE.2 (4) ACC.1 (0.2) | PGMEA(530) |
| 22 | Polym. 1 (80) | PAG. 1 (2) | DRR.1 (4) DRR.3 (4) | NMP (0.05) | | PGMEA/EL(530) |
| 23 | Polym. 1 (80) | PAG. 1 (2) | DRR.2 (4) DRR. 4 (4) | NMP (0.05) | | PGMEA/CH(530) |
| 24 | Polym. 12 (80) | PAG. 1 (2) | | NMP (0.05) | | PGMEA(530) |
| 25 | Polym. 13 (80) | PAG. 1 (2) | | NMP (0.05) | | PGMEA(530) |
| 26 | Polym. 14 (80) | PAG. 1 (2) | | NMP (0.05) | | PGMEA(530) |

DGLM: Diethylene glycol dimethyl ether.
EIPA: 1-Ethoxy-2-propanol.
EL/BA: A mixed solution of ethyl lactate (85% by weight) and butyl acetate (15% by weight).
PGMEA: Propylene glycol monomethyl ether acetate.
PGMEA/EP: A mixed solution of propylene glycol monomethyl ether acetate (90% by weight) and ethyl pyruvate (10% by weight).
PGMEA/CH: A mixed solution of propylene glycol monomethyl ether acetate (90% by weight) and cyclohexanone (10% by weight).
PGMEA/EL: A mixed solution of propylene glycol monoethyl ether acetate (70% by weight) and ethyl lactate (30% by weight).
DBU: 1,8-diazabicycloundecene
DMA: N,N-dimethylacetamide
PE: pyperidineethanol
TEA: triethanolamine
TMEEA: tris{2-(2-methoxyethoxy)ethyl}amine
TMMEA: tris{2-(methoxymethoxy)ethyl}amine
TMEMEA: tris-[2-(2-methoxyethoxy)methoxy)ethyl]amine
TBA: tributylamine
TMEDA: N,N,N', N'-tetramethylenediamine

TABLE 3

| | Evaluated resist material | Sensitivity | Resolution ($\mu$m) | | Profile | | Thermal |
|---|---|---|---|---|---|---|---|
| No. | No. | $E_{op}$(mJ/cm$^2$) | Immediate | PED 2 hr. | Immediate/PED 2 hr. | | resistance |
| Example | | | | | | | |
| 1 | 1 | 6 | 0.2 | 0.2 | Rectangular | | ○ |
| 2 | 2 | 26 | 0.18 | 0.18 | Rectangular | | ○ |
| 3 | 3 | 31 | 0.16 | 0.18 | Rectangular | | ○ |

TABLE 3-continued

| No. | Evaluated resist material No. | Sensitivity $E_{op}(mJ/cm^2)$ | Resolution ($\mu$m) Immediate | PED 2 hr. | Profile Immediate/PED 2 hr. | Thermal resistance |
|---|---|---|---|---|---|---|
| 4 | 4 | 18 | 0.18 | 0.18 | Rectangular | o |
| 5 | 5 | 26 | 0.18 | 0.18 | Rectangular | o |
| 6 | 6 | 26 | 0.18 | 0.18 | Rectanglar | o |
| 7 | 7 | 6 | 0.2 | 0.2 | Rectangular | o |
| 8 | 8 | 6 | 0.2 | 0.2 | Rectangular | o |
| 9 | 9 | 6 | 0.2 | 0.2 | Rectangular | o |
| 10 | 10 | 20 | 0.18 | 0.18 | Rectangular | o |
| 11 | 11 | 5 | 0.2 | 0.2 | Rectangular | o |
| 12 | 12 | 25 | 0.18 | 0.18 | Rectangular | o |
| 13 | 13 | 5 | 0.2 | 0.2 | Rectangular | o |
| 14 | 14 | 5 | 0.2 | 0.2 | Rectangular | o |
| 15 | 15 | 30 | 0.18 | 0.18 | Rectangular | o |
| 16 | 16 | 22 | 0.18 | 0.18 | Rectangular | o |
| 17 | 17 | 23 | 0.18 | 0.18 | Rectangular | o |
| 18 | 18 | 20 | 0.2 | 0.2 | Slightly normal tapered | o |
| 19 | 19 | 24 | 0.2 | 0.2 | Slightly normal tapered | o |
| 20 | 20 | 23 | 0.2 | 0.2 | Slightly normal tapered | o |
| 21 | 21 | 20 | 0.2 | 0.2 | Slightly normal tapered | o |
| 22 | 22 | 19 | 0.18 | 0.18 | Rectangular | o |
| 23 | 23 | 20 | 0.18 | 0.18 | Rectangular | o |
| Comparative Example | | | | | | |
| 24 | 24 | 20 | 0.22 | 0.2 | Rectangular/reverse tapered | x |
| 25 | 25 | 22 | 0.22 | Not resolved | Rectangular/ not resolved | x |
| 26 | 26 | 21 | 0.22 | 0.26 | Rectangular/T-top | x |

(Thermal resistance)
o = No change in pattern shape was observed after heating.
x = A deterioration of the pattern due to heat sagging was observed after heating.

Next, an acetylene alcohol derivative Surfinol E1004 (manufactured by Nisshin Kagaku Co.) was added in an amount enough to be 0.05% content in the total to the above resist compositions of Examples 3, 12, 20 and 21 to yield the resist composition. The storage stability for increase of particles (contamination) was observed using the obtained resist composition. The result is shown in Table 8. In this case, KL-20A (manufactured by Lion Co.) was used as a particle counter and the particles having particle size of 0.3 $\mu$m or more were monitored in the accelerated test for the storage at 40° C.

Surfinol E1004

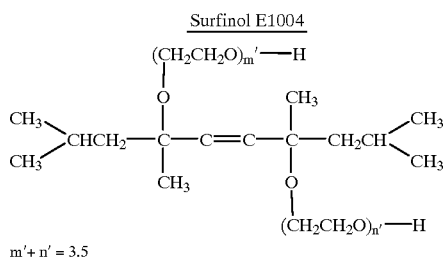

m' + n' = 3.5

TABLE 4

| starting resist compositions | right after filtration (particles/ml) | 4 months later without addition (particles/ml) | 4 months later with additon of Surfinol (particles/ml) |
|---|---|---|---|
| Ex. 3 | 6 | 25 | 7 |
| Ex. 12 | 5 | 20 | 7 |
| Ex. 20 | 7 | 28 | 9 |
| EX. 21 | 7 | 30 | 8 |

We claim:
1. A polymeric compound having a weight-average molecular weight of 1,000 to 500,000 and having one or more hydroxyl and/or carboxyl groups in the molecule, part or all of the hydrogen atoms of the hydroxyl groups and/or the hydrogen atoms of the carboxyl groups being replaced by groups of the following general formula (1):

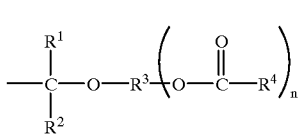

(1)

wherein $R^1$ and $R^2$ are each a hydrogen atom or a straight-chain, branched or cyclic alkyl group of 1 to 6 carbon atoms;

$R^3$ is a (n+1)-valent hydrocarbon group of 1 to 18 carbon atoms which may have one or more heteroatoms;

$R^1$ and $R^2$, $R^1$ and $R^3$, $R^2$ and $R^3$, or $R^1$, $R^2$ and $R^3$ may form a ring, and in cases of ring formation, $R^1$ and $R^2$ are each a divalent or trivalent hydrocarbon group of 1 to 6 carbon atoms, and $R^3$ is a (n+2)- or (n+3)-valent hydrocarbon group of 1 to 18 carbon atoms which may have a heteroatom;

$R^4$ is a monovalent hydrocarbon or alkoxy group of 1 to 18 carbon atoms which may have one or more heteroatoms; and n is an integer of 1 to 6.

2. A polymeric compound according to claim 1 which has repeating units of the following general formula (2):

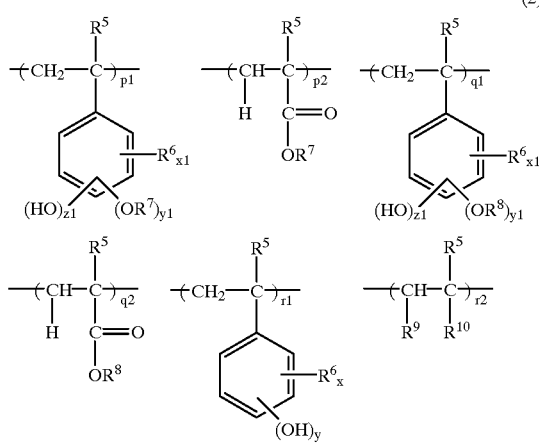

(2)

wherein $R^5$ is a hydrogen atom or a methyl group;

$R^6$ is a straight-chain, branched or cyclic alkyl group of 1 to 8 carbon atoms;

$R^7$ is a group represented the above general formula (1);

$R^8$ is an acid-labile group;

$R^9$ is a hydrogen atom or a cyano group;

$R^{10}$ is a hydrogen atom, a cyano group, or COOY in which Y is a hydrogen atom or a straight-chain, branched or cyclic alkyl group of 1 to 6 carbon atoms;

$R^9$ and $R^{10}$ may be combined with each other to form —CO—O—CO—;

x is 0 or a positive integer and y is a positive integer, and they satisfy the condition represented by $x+y \leq 5$;

$x_1$ and $z_1$ are each 0 or a positive integer and $y_1$ is a positive integer, and they satisfy the condition represented by $x_1+y_1+z_1 \leq 5$; and $p_1$, $p_2$, $q_1$, $q_2$, $r_1$ and $r_2$ are molar proportions and satisfy the condition represented by $p_1+p_2+q_1+q_2+r_1+r_2=1$, provided that all of them can be 0, but $p_1$ and $p_2$ cannot be 0 at the same time and $r_1$ and $r_2$ cannot be 0 at the same time, and they satisfy the conditions represented by $0 \leq p_1 \leq 0.8$, $0 \leq p_2 \leq 0.8$, $0 \leq q_1 \leq 0.4$, $0 \leq q_2 \leq 0.4$ and $0 < p_1+p_2+q_1+q_2 \leq 0.8$.

3. A polymeric compound according to claim 1 which has repeating units of the following general formula (3):

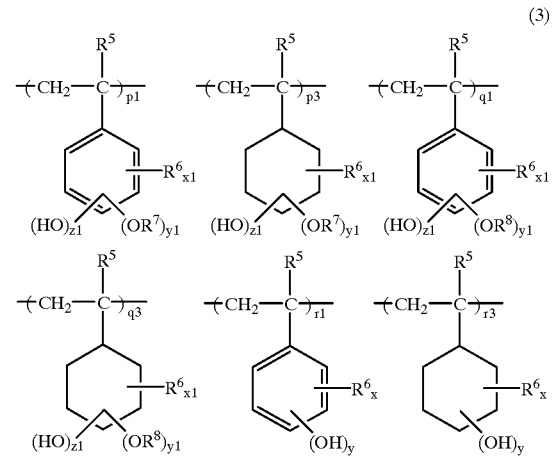

(3)

wherein $R^5$ is a hydrogen atom or a methyl group;

$R^6$ is a straight-chain, branched or cyclic alkyl group of 1 to 8 carbon atoms;

$R^7$ is a group represented the above general formula (1);

$R^8$ is an acid-labile group;

x is 0 or a positive integer and y is a positive integer, and they satisfy the condition represented by $x+y \leq 5$;

$x_1$ and $z_1$ are each 0 or a positive integer and $y_1$ is a positive integer, and they satisfy the condition represented by $x_1+y_1+z_1 \leq 5$; and $p_1$, $p_3$, $q_1$, $q_3$, $r_1$ and $r_3$ are molar proportions and satisfy the condition represented by $p_1+p_2+q_1+q_2+r_1+r_2=1$, provided that neither $p_1$ nor $r_1$ can be 0, all of $p_3$, $q_1$, $q_3$ and $r_3$ can be 0, but $p_3$, $q_3$ and $r_3$ cannot be 0 at the same time, and they satisfy the conditions represented by $0 < p_1 \leq 0.8$, $0 \leq p_3 \leq 0.8$, $0 \leq q_1 \leq 0.4$, $0 \leq q_3 \leq 0.4$ and $0 < p_1+p_3+q_1+q_3 \leq 0.8$.

4. A polymeric compound according to claim 1 which has repeating units of the following general formula (4):

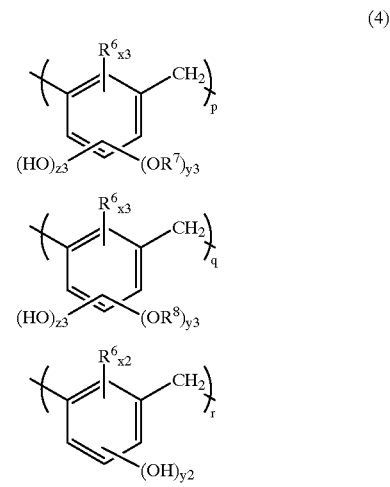

(4)

wherein $R^6$ is a straight-chain, branched or cyclic alkyl group of 1 to 8 carbon atoms;

$R^7$ is a group represented the above general formula (1);

$R^8$ is an acid-labile group;

$x_2$ is 0 or a positive integer and $y_2$ is a positive integer, and they satisfy the condition represented by $x_2+y_2 \leq 4$;

$x_3$ and $z_3$ are each 0 or a positive integer and $y_3$ is a positive integer, and they satisfy the condition represented by $x_3+y_3+z_3 \leq 4$; and p, q and r are molar proportions and satisfy the condition represented by p+q+r=1, provided that neither p nor r can be 0, q can be 0, and they satisfy the conditions represented by $0<p \leq 0.8$, $0 \leq q \leq 0.4$ and $0<p+q \leq 0.8$.

5. A polymeric compound according to claim 1 wherein hydrogen atoms of phenolic hydroxide groups and/or hydrogen atoms of carboxyl groups of the repeating units of the above general formula (1) are replaced in a ratio of more than 0 and up to 50 mole % for the formation of intramolecular and/or intermolecular crosslinkage by a group having a C—O—C group shown as the following general formula (CR1) and/or (OR2):

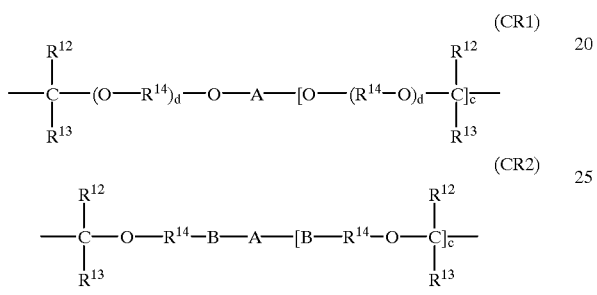

wherein
$R^{12}$ and $R^{13}$ are each a hydrogen atom or a straight-chain, branched or cyclic alkyl group of 1 to 8 carbon atoms;

$R^{12}$ and $R^{13}$ may form a ring, and in cases of ring formation, $R^{12}$ and $R^{13}$ are each a straight-chain or branched alkylene group of 1 to 8 carbon atoms;

$R^{14}$ is a straight-chain or branched alkylene group of 1 to 10 carbon atoms;

c is a positive integer of 1 to 7 and d is 0 or a positive integer of 1 to 10;

A is a (c+1)-valent aliphatic or alicyclic saturated hydrocarbon group of 1 to 50 carbon atoms, aromatic hydrocarbon group or heterocyclic group, wherein each group may have one or more heteroatoms, or part of hydrogen atoms bonding to carbon atoms of the group may be replaced by hydroxide groups, carboxyl groups, acyl groups or fluoride atoms;

B is —CO—O—, —NHCO—O—, or —NHCONH—.

6. A chemically amplified positive resist material containing an organic solvent (A), a base resin (B) comprising a polymeric compound according to claim 1, and an acid generator (C).

7. A chemically amplified positive resist material containing an organic solvent (A), a base resin (B) comprising a polymeric compound according to claim 5, and an acid generator (C).

8. A chemically amplified positive resist material according to claim 6 which further contains, in addition to said base resin (B), another base resin (D) comprising a polymeric compound having a weight-average molecular weight of 3,000 to 300,000 and having repeating units of the following general formulae (5) and/or (6) and/or (7), the hydrogen atoms of the hydroxyl groups present therein and/or the hydrogen atoms of the carboxyl groups present therein being partially replaced by acid-labile groups to an overall average degree of substitution of 0 to 80 mole %:

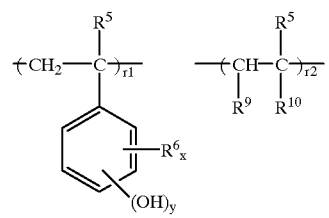

wherein
$R^5$ is a hydrogen atom or a methyl group;
$R^6$ is a straight-chain, branched or cyclic alkyl group of 1 to 8 carbon atoms;
$R^9$ is a hydrogen atom or a cyano group;
$R^{10}$ is a hydrogen atom, a cyano group, or COOY in which Y is a hydrogen atom or a straight-chain, branched or cyclic alkyl group of 1 to 6 carbon atoms;
$R^9$ and $R^{10}$ may be combined with each other to form —CO—O—CO—;
x is 0 or a positive integer and y is a positive integer, and they satisfy the condition represented by $x+y \leq 5$; and
$r_1$ and $r_2$ are molar proportions and satisfy the condition represented by $r_1+r_2=1$, provided that both $r_1$ and $r_2$ can be 0, but $r_1$ and $r_2$ cannot be 0 at the same time:

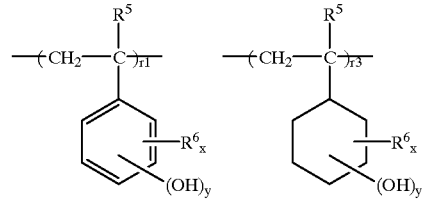

wherein
$R^5$ is a hydrogen atom or a methyl group;
$R^6$ is a straight-chain, branched or cyclic alkyl group of 1 to 8 carbon atoms;
x is 0 or a positive integer and y is a positive integer, and they satisfy the condition represented by $x+y \leq 5$; and
$r_1$ and $r_3$ are molar proportions and satisfy the condition represented by $r_1+r_3=1$, provided that neither $r_1$ nor $r_3$ can be 0:

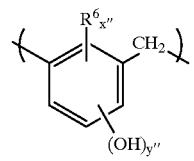

wherein
$R^6$ is a straight-chain, branched or cyclic alkyl group of 1 to 8 carbon atoms; and
$x_2$ is 0 or a positive integer and $y_2$ is a positive integer, and they satisfy the condition represented by $x_2+y_2 \leq 4$.

9. A chemically amplified positive resist material according to claim 7 which further contains, in addition to said base resin (B), another base resin (D) comprising a polymeric compound having a weight-average molecular weight of 3,000 to 300,000 and having repeating units of the following general formulae (5) and/or (6) and/or (7), the hydrogen atoms of the hydroxyl groups present therein and/or the hydrogen atoms of the carboxyl groups present therein being partially replaced by acid-labile groups to an overall average degree of substitution of 0 to 80 mole %:

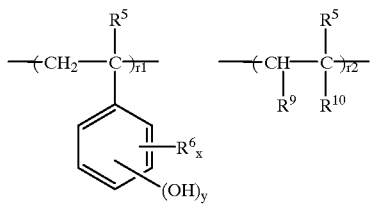

(5)

wherein
$R^5$ is a hydrogen atom or a methyl group;
$R^6$ is a straight-chain, branched or cyclic alkyl group of 1 to 8 carbon atoms;
$R^9$ is a hydrogen atom or a cyano group;
$R^{10}$ is a hydrogen atom, a cyano group, or COOY in which Y is a hydrogen atom or a straight-chain, branched or cyclic alkyl group of 1 to 6 carbon atoms;
$R^9$ and $R^{10}$ may be combined with each other to form —CO—O—CO—;
x is 0 or a positive integer and y is a positive integer, and they satisfy the condition represented by $x+y \leq 5$; and
$r_1$ and $r_2$ are molar proportions and satisfy the condition represented by $r_1+r_2=1$, provided that both $r_1$ and $r_2$ can be 0, but $r_1$ and $r_2$ cannot be 0 at the same time:

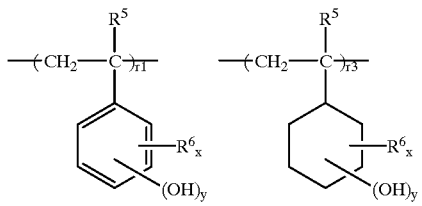

(6)

wherein
$R^5$ is a hydrogen atom or a methyl group;
$R^6$ is a straight-chain, branched or cyclic alkyl group of 1 to 8 carbon atoms;
x is 0 or a positive integer and y is a positive integer, and they satisfy the condition represented by $x+y \leq 5$; and
$r_1$ and $r_3$ are molar proportions and satisfy the condition represented by $r_1+r_3=1$, provided that neither $r_1$ nor $r_3$ can be 0:

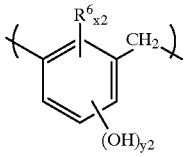

(7)

wherein
$R^6$ is a straight-chain, branched or cyclic alkyl group of 1 to 8 carbon atoms; and
$x_2$ is 0 or a positive integer and $y_2$ is a positive integer, and they satisfy the condition represented by $x_2+y_2 \leq 4$.

10. A chemically amplified positive resist material according to claim 6 which further contains a dissolution inhibitor (E).

11. A chemically amplified positive resist material according to claim 7 which further contains a dissolution inhibitor (E).

12. A chemically amplified positive resist material according to claim 6 which further contains a basic compound (F) as an additive.

13. A chemically amplified positive resist material according to claim 7 which further contains a basic compound (F) as an additive.

14. A chemically amplified positive resist material according to claim 6 which further contains an aromatic compound (G) having a group of the formula ≡C—COOH in the molecule as an additive.

15. A chemically amplified positive resist material according to claim 7 which further contains an aromatic compound (G) having a group of the formula ≡C—COOH in the molecule as an additive.

16. A chemically amplified positive resist material according to claim 6 which further contains an ultraviolet absorber (H).

17. A chemically amplified positive resist material according to claim 7 which further contains an ultraviolet absorber (H).

18. A chemically amplified positive resist material according to claim 6 which further contains an acetylene alcohol derivative (I).

19. A chemically amplified positive resist material according to claim 7 which further contains an acetylene alcohol derivative (I).

* * * * *